United States Patent
Kirchhofer et al.

(10) Patent No.: US 12,401,345 B2
(45) Date of Patent: Aug. 26, 2025

(54) STACKED ACOUSTIC WAVE (AW) PACKAGES WITH REDUCED EXCITATION OF REFLECTED BULK WAVES

(71) Applicant: RF360 SINGAPORE PTE. LTD., Republic Plaza (SG)

(72) Inventors: Peter Kirchhofer, Munich (DE); Simone Colasanti, Bayem (DE); Nadine Erhard-Egeler, Munich (DE); Franz Kubat, Munich (DE); Volker Schulz, Munich (DE); Philipp Schwegler, Bavaria (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 323 days.

(21) Appl. No.: 17/929,092

(22) Filed: Sep. 1, 2022

(65) Prior Publication Data

US 2024/0080013 A1    Mar. 7, 2024

(51) Int. Cl.
| | |
|---|---|
| *H03H 9/64* | (2006.01) |
| *H03H 9/02* | (2006.01) |
| *H03H 9/05* | (2006.01) |
| *H03H 9/10* | (2006.01) |
| *H03H 9/25* | (2006.01) |

(52) U.S. Cl.
CPC ...... *H03H 9/6489* (2013.01); *H03H 9/02866* (2013.01); *H03H 9/059* (2013.01); *H03H 9/1092* (2013.01); *H03H 9/25* (2013.01); *H03H 9/6443* (2013.01)

(58) Field of Classification Search
CPC ........... H03H 9/6433; H03H 9/64; H03H 9/25
USPC ................................................. 333/186–193
See application file for complete search history.

(56) References Cited

U.S. PATENT DOCUMENTS

| | | |
|---|---|---|
| 2013/0057113 A1 | 3/2013 | Miyake |
| 2014/0320234 A1 | 10/2014 | Takemura |
| 2017/0187353 A1 | 6/2017 | Hirano et al. |
| 2018/0269849 A1* | 9/2018 | Matsumoto .............. H03H 9/25 |
| 2020/0321939 A1 | 10/2020 | Turner et al. |
| 2020/0358464 A1* | 11/2020 | Abbott ................. H03H 9/6406 |
| 2021/0376816 A1 | 12/2021 | Bywalez et al. |
| 2021/0408994 A1 | 12/2021 | Nagatomo et al. |

OTHER PUBLICATIONS

International Search Report and Written Opinion—PCT/SG2023/050539—ISA/EPO—Nov. 29, 2029.

* cited by examiner

*Primary Examiner* — Rakesh B Patel
(74) *Attorney, Agent, or Firm* — Polsinelli

(57) ABSTRACT

Aspects of the disclosure relate to devices, wireless communication apparatuses, methods, and circuitry implementing bulk wave suppression in a stacked electroacoustic device. One aspect includes a first substrate comprising a first surface and a second surface, where the second surface is opposite the first surface, a first AW resonator circuit positioned on the first surface of the first substrate, a plurality of elements including a first element, where the plurality of elements are positioned on the second surface of the first substrate, and where the first element is aligned with the first AW resonator circuit, and a second substrate comprising a first surface and a second surface, where the plurality of elements are positioned on the first surface of the second substrate, and where the plurality of elements create a cavity between the first substrate and the second substrate.

29 Claims, 13 Drawing Sheets

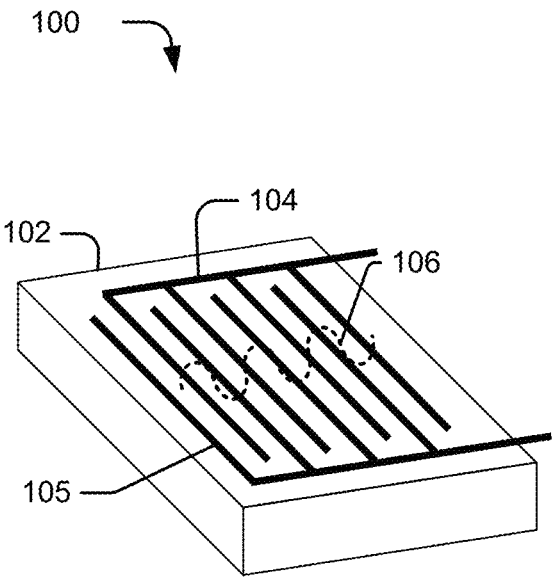
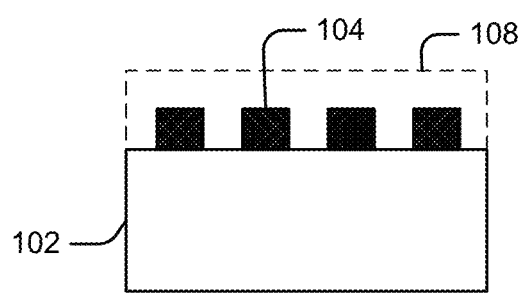
FIG. 1A
FIG. 1B
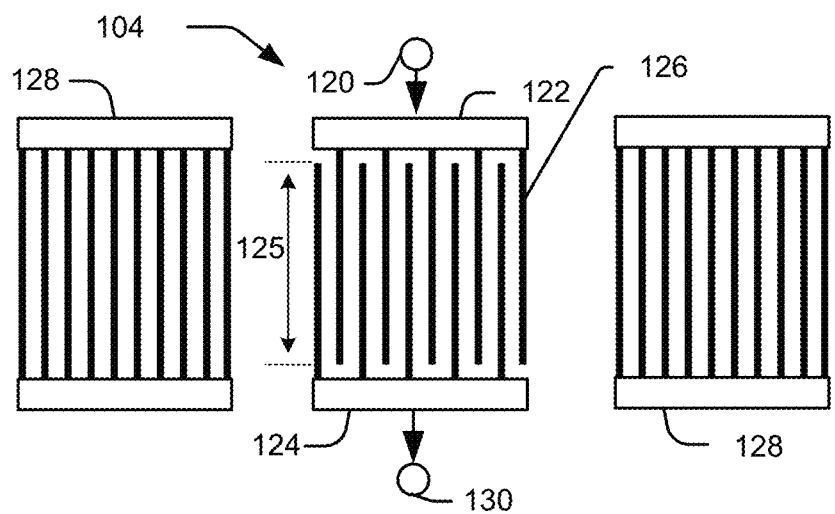
FIG. 1C

700

```
┌─────────────────────────────────────────────┐
│ PROVIDE A SIGNAL AT AN INTERCONNECT OF A    │
│ STACKED ACOUSTIC WAVE (AW) FILTER PACKAGE,  │
│ WHEREIN THE INTERCONNECT IS POSITIONED ON A │
│ CAP SUBSTRATE                               │
│ 702                                         │
└─────────────────────────────────────────────┘
                      │
                      ▼
┌─────────────────────────────────────────────┐
│ EXCITE AN ACOUSTIC WAVE AT A FIRST AW       │
│ RESONATOR CIRCUIT POSITIONED ON A FIRST     │
│ SUBSTRATE AT A SEPARATE STACK LAYER FROM    │
│ THE CAP SUBSTRATE, WHEREIN THE FIRST AW     │
│ RESONATOR CIRCUIT IS ELECTRICALLY COUPLED   │
│ TO THE INTERCONNECT, AND WHEREIN THE FIRST  │
│ AW RESONATOR CIRCUIT IS POSITIONED WITHIN   │
│ A FIRST CAVITY SUPPORTED BY ELEMENTS        │
│ BETWEEN THE CAP SUBSTRATE AND THE FIRST     │
│ SUBSTRATE                                   │
│ 704                                         │
└─────────────────────────────────────────────┘
                      │
                      ▼
┌─────────────────────────────────────────────┐
│ DAMPEN BULK WAVES IN THE FIRST SUBSTRATE    │
│ FROM THE FIRST AW RESONATOR CIRCUIT USING A │
│ REFLECTION SUPPRESSION ELEMENT POSITIONED   │
│ AT AN OPPOSITE SIDE OF THE FIRST SUBSTRATE  │
│ FROM THE FIRST AW RESONATOR CIRCUIT,        │
│ WHEREIN THE REFLECTION SUPPRESSION ELEMENT  │
│ FURTHER IS POSITIONED TO SUPPORT A SECOND   │
│ CAVITY BETWEEN THE FIRST SUBSTRATE AND A    │
│ SECOND SUBSTRATE, AND WHEREIN THE SECOND    │
│ SUBSTRATE IS AT AN ADDITIONAL SEPARATE      │
│ STACK LAYER FROM BOTH THE CAP SUBSTRATE     │
│ AND THE FIRST SUBSTRATE                     │
│ 706                                         │
└─────────────────────────────────────────────┘
```

FIG. 7

STACKED ACOUSTIC WAVE (AW) PACKAGES WITH REDUCED EXCITATION OF REFLECTED BULK WAVES

FIELD

The present disclosure relates generally to electronic communications and acoustic wave (AW) circuits. For example, aspects of the present disclosure relate to surface acoustic wave (SAW) filter circuits in stacked packages with structures configured to reduce excitation of reflected bulk waves within the stacked packages.

BACKGROUND

Electronic devices include traditional computing devices, such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content, such as voice, video, packet data, messaging, broadcast, and so on. These systems may be capable of supporting communication with multiple users by sharing the available system resources (e.g., time, frequency, and power). Aspects of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters" or "acoustic wave (AW) filters") are used for filtering signals in many applications. Using a piezoelectric material as a vibrating medium, acoustic resonators operate by transforming an electrical signal wave, that is propagating along an electrical conductor, into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. The smaller filter device permits acoustic resonators to be used in electronic devices having size constraints, such as the electronic devices enumerated above (e.g., particularly including portable electronic devices, such as cellular phones). Such AW filters are, however, subject to generating spurious waves (e.g., bulk waves) which can cause signal interference in a device. Reducing the impact of such bulk waves can improve the operation of a device.

SUMMARY

Disclosed are systems, apparatuses, methods, and computer-readable media for electronic communications and, more specifically, to devices, wireless communication apparatuses, and circuitry implementing a stacked AW resonator package configured to dampen or reduce excitation of bulk waves that can degrade device performance.

According to at least one example, an apparatus for RF signal filtering is provided. The apparatus includes a stacked acoustic wave (AW) filter package comprising: a first substrate having a first plurality of AW resonator circuits positioned on a top side; a second substrate having a second plurality of AW resonator circuits positioned on a top side; a frame positioned between the first substrate and the second substrate to create a cavity between a bottom side of the first substrate and the top side of the second substrate; and one or more acoustic reflection suppressing structural walls supporting the cavity between the bottom side of the first substrate and the top side of the second substrate, the one or more acoustic reflection suppressing structural walls being positioned at selected positions on a back side of the first substrate to dampen selected acoustic bulk wave paths from the first plurality of AW resonator circuits that generate interference in signal paths of the stacked AW filter package.

In another aspect, a method is provided for filtering a radio frequency (RF) signal. The method includes providing a signal at an interconnect of a stacked acoustic wave (AW) filter package, where the interconnect is positioned on a cap substrate, exciting an acoustic wave at a first AW resonator circuit positioned on a first substrate at a separate stack layer from the cap substrate, where the first AW resonator circuit is electrically coupled to the interconnect, and where the first AW resonator circuit is positioned within a first cavity supported by elements between the cap substrate and the first substrate, and dampening bulk waves in the first substrate from the first AW resonator circuit using a reflection suppression element positioned at an opposite side of the first substrate from the first AW resonator circuit, where the reflection suppression element further is positioned to support a second cavity between the first substrate and a second substrate, and where the second substrate is at an additional separate stack layer from both the cap substrate and the first substrate.

In another aspect, a wireless communication apparatus is provided. The wireless communication apparatus includes a first substrate comprising a first surface and a second surface, where the second surface is opposite the first surface; first electroacoustic means for filtering a radio frequency signal, where the first electroacoustic means is positioned on the first surface of the first substrate; and means for suppressing acoustic bulk waves at the second surface of the first substrate.

According to at least one additional example, an apparatus for RF signal filtering using a stacked AW package with reduced excitation of bulk waves is provided. The apparatus includes: a first substrate comprising a first surface and a second surface, where the second surface is opposite the first surface; a first AW resonator circuit positioned on the first surface of the first substrate; a plurality of elements including a first element, where the plurality of elements are positioned on the second surface of the first substrate, and where the first element is aligned with the first AW resonator circuit; and a second substrate comprising a first surface and a second surface, where the plurality of elements are positioned on the first surface of the second substrate, and where the plurality of elements create a cavity between the first substrate and the second substrate.

In some aspects, a second AW resonator circuit is positioned on the first surface of the second substrate in the cavity between the first substrate and the second substrate.

In some aspects, the second AW resonator circuit is positioned between the first element and a second element.

In some aspects, a first plurality of AW resonator circuits is disposed on the first surface of the first substrate, the first plurality of AW resonator circuits including the first AW resonator circuit and a second plurality of AW resonator circuits is disposed on the first surface of the second substrate, the second plurality of AW resonator circuits including the second AW resonator circuit; where the first plurality of AW resonator circuits and the second plurality of AW resonator circuits are each electrically coupled to a corresponding signal path as portions of a radio frequency (RF) filter.

In some aspects, a mold material covering at least a portion of the second surface of the second substrate is provided, where the mold material is aligned with a position of the second AW resonator circuit to dampen reflections of bulk waves entering the second substrate from the second AW resonator circuit.

In some aspects, a cap substrate having a first surface and a second surface is provided, along with a second plurality of elements positioned on the first surface of the first substrate and the second surface of the cap substrate to create a second cavity, where the second cavity is positioned between the first substrate and the cap substrate.

In some aspects, the plurality of elements comprise polymer elements, and the second plurality of elements comprise polymer elements.

In some aspects, the plurality of elements comprise uniform metal elements, and the second plurality of elements comprise uniform metal elements.

In some aspects, a uniform polymer layer is provided, the uniform polymer layer covering at least a portion of the second surface of the first substrate within a range of a reflected bulk wave path from the first AW resonator circuit through the first substrate.

In some aspects, the plurality of elements provide structural support to maintain a physical position of the first substrate and the second substrate within the stacked AW filter circuit.

In some aspects, a polymer frame disposed on the second surface of the first substrate and on the first surface of the second substrate is provided, where the polymer frame is positioned at edge portions of the first surface of the second substrate and edge portions of the second surface of the first substrate to enclose the cavity.

In some aspects, the first element extends from the polymer frame at an edge portion of the first surface of the second substrate into the cavity.

In some aspects, the first element is positioned within the cavity without connecting to the polymer frame at the edge portions of the first surface of the second substrate or the edge portions of the second surface of the first substrate.

In some aspects, the first AW resonator circuit comprises a plurality of surface acoustic wave (SAW) resonators.

In some aspects, the first element is aligned with the first AW resonator circuit such that one or more bulk waves enter the first substrate from the first AW resonator circuit at positions between the first AW resonator circuit and the first element.

In some aspects, the first element is a polymer structural support wall for the first substrate, and the first element is positioned such that one or more bulk waves enter the first substrate from the first AW resonator and are reflected where the second surface of the first substrate is in contact with the first element.

In some aspects, the first AW resonator includes an interdigital transducer (IDT) electrode structure positioned on a piezoelectric surface in a first plane parallel to the first surface of the first substrate, where the first element contacts the second surface of the first substrate in an acoustic reflection dampening area of a second plane parallel to the first plane.

In some aspects, the first element is positioned such that a projection of an area of the IDT electrode structure onto the second plane in a direction perpendicular to the first plane results in the projection at the second plane overlapping with the acoustic reflection dampening area in the second plane.

In some aspects, the AW filter device is integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

In some aspects, the AW filter device is integrated into a radio frequency (RF) front-end circuit of a transceiver.

In some aspects, the front-end circuit of the transceiver comprises a multiplexer (e.g., a duplexer) coupled to an antenna, where the multiplexer comprises the stacked AW filter circuit.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

FIG. 1A is a diagram of a perspective view of an example of an electroacoustic device;

FIG. 1B is a diagram of a side view of the electroacoustic device of FIG. 1A;

FIG. 1C is a diagram of a top view of an example of an electrode structure of an example electroacoustic device;

FIG. 7 is a flowchart illustrating a method of operation of a stacked AW filter, in accordance with examples described herein;

DETAILED DESCRIPTION

Figure 2A:
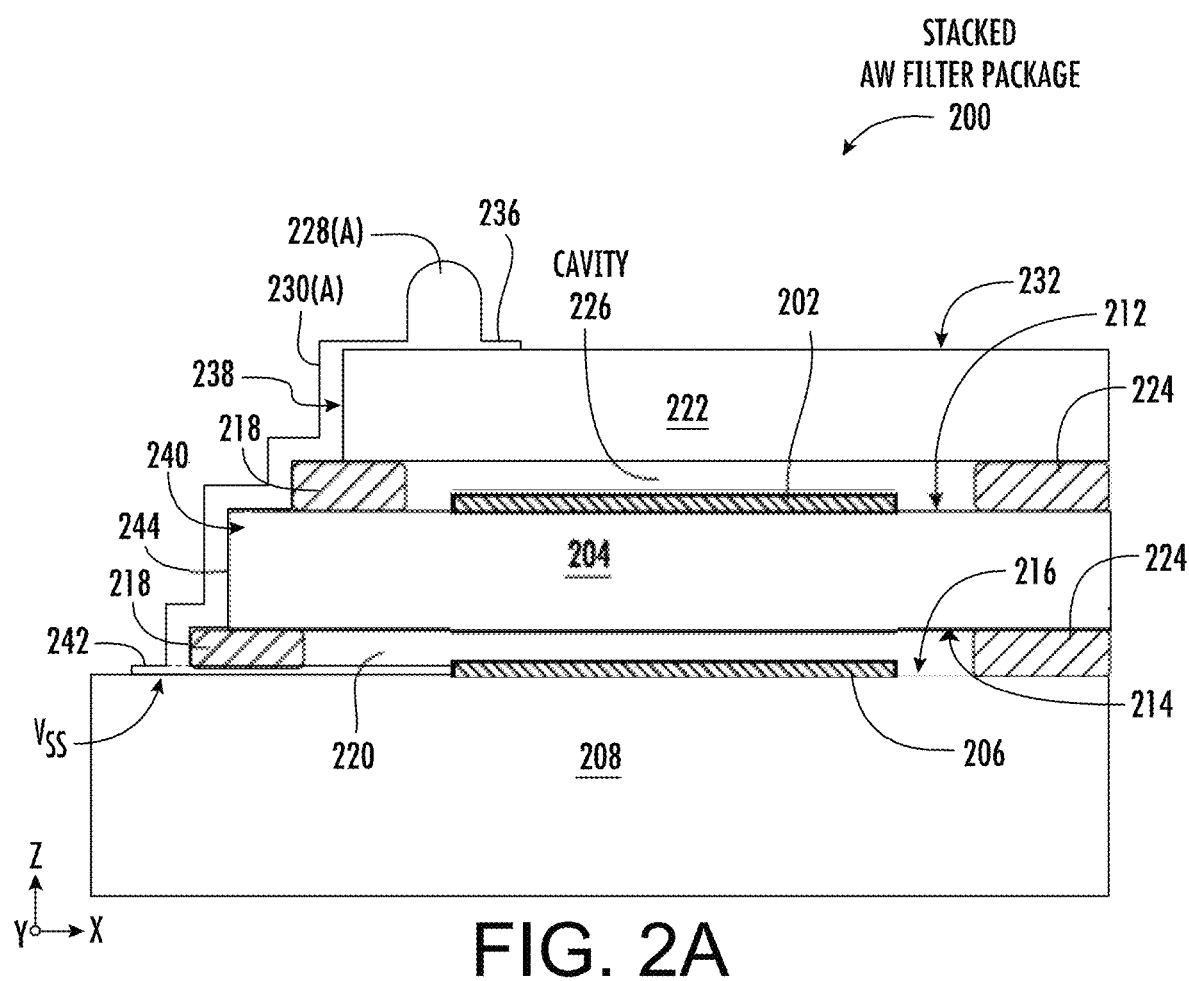
FIG. 2A is an illustration of a side view of cross-sections through a ground pin or a signal pin of some elements of a stacked AW filter package in accordance with aspects described herein.

The detailed description set forth below in connection with the appended drawings is intended as a description of exemplary implementations and is not intended to represent the only implementations in which the invention may be practiced. The term "exemplary" means "serving as an example, instance, or illustration," and should not necessarily be construed as preferred or advantageous over other implementations, including the implementations specifically described and any other implementation apparent from the specific aspects described herein. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices, also referred to herein as acoustic wave (AW) resonators, are devices with high-Q performance characteristics at frequencies above several megahertz (MHz), and provide performance that is valuable in many wireless communication devices. While certain performance characteristics of AW resonators are valuable, filter circuits made with AW resonators on piezoelectric substrates with limited thickness to meet device size criteria can transmit bulk waves within the substrates that the resonator circuits are mounted on (e.g., bulk waves or other spurious modes may be an acoustic wave mode propagating in a direction different, such as in a perpendicular direction, to the direction of an operational wave mode such as a surface acoustic wave mode). The bulk waves can travel through a substrate, reflect off of a back side, and be sensed by the same AW resonator or other AW resonators (e.g., other acoustic transducers) and circuits, resulting in spurious signals, noise, and reduced device performance.

Additionally, as space and size constraints become tighter in device designs, stacking substrates can address size constraints, but can limit options for addressing bulk waves. Stacking substrates can also make bulk wave issues larger, as the space for the bulk wave to dissipate over distances is reduced. At outside stacks or edges of a device, molding or other packaging can be used to dampen bulk waves and limit the propagation of energy via reflected bulk waves to unwanted places within a design. In a stacked circuit, space for dampening structures is limited, and inner substrate surfaces do not have contact with mold materials to provide mechanical dampening to reduce the excitation of reflected bulk waves. Stacked circuits do, however, use supporting structures to maintain the mechanical integrity of the stack.

According to aspects described herein, stacked AW resonator circuits are provided with frame and wall structures positioned in particular locations to provide targeted dampening of reflected bulk waves. Use of the frame and wall structures facilitates stacking of AW resonator circuits, and device performance can be improved by relocating certain frame and wall structures to dampen the reflected bulk waves. For instance, such structures allow compact stacked packaging of AW filter circuits while enabling targeted dampening of reflected bulk waves to meet performance targets. In some examples, reflected bulk wave paths in a design that cause problems with performance targets can be identified, and nearby support or wall structures can be relocated or added with limited adjustments to AW resonator circuit placement, while reflected bulk wave paths that do not impact device performance targets can be ignored. Aspects described herein thus allow improved device performance with minor adjustments of circuit and supporting structure (e.g., polymer wall) positions to allow mechanically sound stacked AW circuits with reduced excitation of reflected bulk waves (e.g., improving performance related to communication band specific insertion loss or attenuation) improvements based on the position of elements within a stacked AW package. Details regarding aspects of the present disclosure are described in more detail below with respect to the figures.

FIG. 1A is a diagram of a perspective view of an example of an electroacoustic device. The electroacoustic device may be configured as, or be a portion of, a surface acoustic wave (SAW) resonator. In certain descriptions herein, the electroacoustic device 100 may be referred to as a SAW resonator which can be incorporated into an AW filter (e.g., stacked AW filters as described further below). However, there may be other electroacoustic device types (e.g., AW resonators such as bulk acoustic wave (BAW) or thin film (TFBAR) resonators) that may be constructed based on the principles described herein, and any of which may be incorporated into an AW filter made using AW resonators (e.g., SAW resonators, BAW resonators, or other AW resonators). While the examples described below particularly relate to SAW resonators, aspects described herein may be applicable to other types of AW resonators. An AW filter described herein can include AW resonators configured within a device to suppress bulk waves, in addition to BAW resonators. A BAW resonator uses resonance across layers of (e.g., as compared to the comb structure in a single layer of a SAW resonator). Such BAW resonator structures are less likely to generate additional spurious bulk waves, but have different performance characteristics which prevent BAW resonators from being used in place of SAW resonators to improve performance degradation from reflected bulk waves. In some implementations, an AW filter can use a combination of BAW and SAW resonators, with the structures described herein configured to reduce noise from bulk waves generated by the SAW resonators in the combined structure.

The electroacoustic device 100 includes an electrode structure 104, that may be referred to as an interdigital transducer (IDT), on the surface of a piezoelectric material 102. The electrode structure 104 generally includes first and second electrode structures (e.g., conductive, generally metallic, cone-shaped, etc.) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device of FIG. 1A, along a cross-section shown in FIG. 1A. The electroacoustic device is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobate (LiNbO3), doped variants of these, or other piezoelectric materials. It should be appreciated that more complicated layer stacks (e.g., four (4) layers, six (6) layers, etc.), including layers of various materials, may be possible within the stack. For example, optionally, a temperature compensation layer 108 (denoted by the dashed lines) may be disposed above the electrode structure 104. As another example, the piezoelectric material 102 may be part of multi-layer substrate that may include another base substrate such as a silicon substrate (e.g., for a thin-film SAW device the piezoelectric layer may be formed on a temperature compensation layer, a charge trapping layer, a high resistivity layer (e.g., silicon), or other such layer stacks). The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

FIG. 1C is a diagram of a top view of an example of the electroacoustic device including the electrode structure 104 along with end reflectors. FIG. 1C generally illustrates a two-port configuration of an electroacoustic (e.g. AW) device. The electrode structure 104 has an IDT 105 that includes a first busbar 122 (e.g., first conductive segment or rail) electrically connected to a first terminal 120 and a second busbar 124 (e.g., second conductive segment or rail) spaced from the first busbar 122 and connected to a second terminal 130. A plurality of conductive fingers 126 are connected to either the first busbar 122 or the second busbar 124 in an interdigitated manner. Fingers 126 connected to the first busbar 122 extend towards the second busbar 124 but do not connect to the second busbar 124 so that there is a small gap between the ends of these fingers 126 and the second busbar 124. Likewise, fingers 126 connected to the second busbar 124 extend towards the first busbar 122 but do not connect to the first busbar 122 so that there is a small gap between the ends of these fingers 126 and the first busbar 122.

In the direction along the busbars 122 and 124, there is an overlap region including a central region where a portion of one finger overlaps with a portion of an adjacent finger (as illustrated by the central region 125). The central region 125 including the overlap may be referred to as the aperture, track, or active region where electric fields are produced between fingers 126 to cause an acoustic wave to propagate in the piezoelectric material 102. The periodicity of the fingers 126 is referred to as the pitch of the IDT. The pitch may be indicted in various ways. For example, in certain aspects, the pitch may correspond to a magnitude of a distance between fingers in the central region 125. The distance may be defined, for example, as the distance between center points of each of the fingers (and may be generally measured between a right (or left) edge of one finger and the right (or left) edge of an adjacent finger when the fingers have uniform thickness). As described herein, a "higher" pitch refers to sections of an IDT where electrode fingers have greater distances between adjacent electrode fingers, and a "lower" pitch refers to sections of an IDT where electrode fingers have lower distances between adjacent electrode fingers. In certain aspects, an average of distances between adjacent fingers may be used for the pitch. Having sections of an IDT with electrode fingers having a given pitch characteristic different from pitch characterizations of other sections of an IDT allows for selection or control of the signals (e.g., waves) that propagate through the IDT. The frequency at which the piezoelectric material vibrates is a self-resonance (also called a "main-resonance") frequency of the electrode structure 104. The frequency is determined at least in part by the pitch of the IDT 105 and other properties of the electroacoustic device 100.

In some examples, the pitch characteristics of sections of an IDT can be a constant pitch, where the pitch does not vary significantly over the IDT section (e.g., variances are within manufacturing tolerances, and are designed for a constant average pitch). In other examples, pitch characteristics of an IDT section can include a "chirped" pitch, where the pitch varies in a predefined way over the IDT section. For example, a chirped pitch can include an IDT section where the pitch is designed to change linearly across the IDT section, such that the pitch at one end of the IDT section is at a first value, the pitch at an opposite end of the IDT section is at a second value, and the pitch (e.g., the distance between electrode fingers) changes linearly between the two ends of the IDT section. In other examples, other non-linear variations in pitch value across an IDT section can be used. By combining IDT sections with different pitch characteristics (e.g., a constant pitch at a first value and a constant pitch at a second value, or a constant pitch at a first value in one IDT section and a chirped pitch across a second IDT section), the resonator characteristics can be designed for a given performance in a circuit, with multiple AW resonators able to be combined together to form a filter, as described in FIG. 10 below.

The IDT 105 is arranged between two reflectors 128 which reflect the acoustic wave back towards the IDT 105 for the conversion of the acoustic wave into an electrical signal via the IDT 105 in the configuration shown and to prevent losses (e.g., confine and prevent escaping acoustic waves). Each reflector 128 has two busbars and a grating structure of conductive fingers that each connect to both busbars. The pitch of the reflector may be similar to or the same as the pitch of the IDT 105 to reflect acoustic waves in the resonant frequency range. But many configurations are possible.

When converted back to an electrical signal, the measured admittance or reactance between both terminals (e.g., the first terminal 120 and the second terminal 130) serves as the signal for the electroacoustic device 100, and allow the electroacoustic device 100 to be used in a signal path as part of a communication apparatus.

Figure 2B:
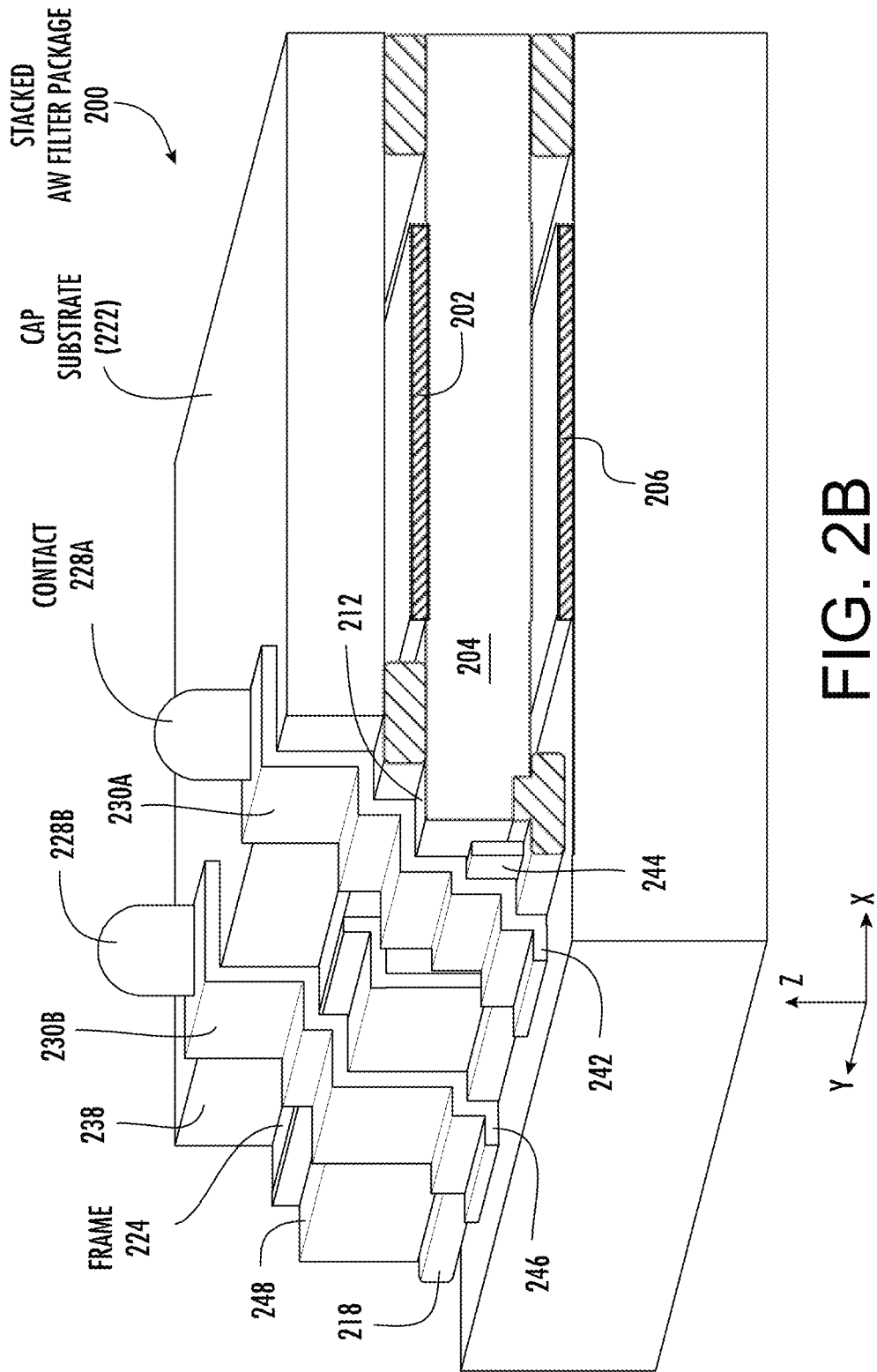
FIG. 2B is a perspective view of portions of a stacked AW filter package, in accordance with aspects described herein.

FIG. 2A is an illustrations of cross-sectional side views of a stacked AW filter package 200 that includes a first AW resonator circuit 202 (e.g., a SAW resonator circuit as described above) on a first substrate 204 and a second AW resonator circuit 206 on a second substrate 208 to provide electroacoustic resonators that can be coupled together to form filter circuits. In some implementations, such AW resonator circuits 202 and 206 can be connected via a redistribution layer and a shared substrate, rather than structured on separate substrates as shown in FIG. 2A. Each of the first substrate 204 and the second substrate 208 may have additional electroacoustic devices (e.g., in addition to AW resonator circuits 202 and 206) similar to the electroacoustic device 100 in FIGS. 1A-C as part of an AW filter circuit. FIG. 2A is a side view of a cross-section of the stacked AW filter package 200 through a ground pad 242. FIG. 2B is a side view of a cross-section of the stacked AW filter package 200 through a signal pad 246. In some aspects, the ground pad 242 can be a signal pad and the signal pad 246 can be a ground pad. In further aspects, all combinations of signa/ground pads are possible, and the particular implementation of FIGS. 2A and 2B are illustrative examples of one possible cross section.

In some implementations, the substrates 204 and 208 may include a piezoelectric layer as part of the described substrate. In other implementations, the AW resonator circuits 202 and 206 may include a piezoelectric layer that may or may not be integrated with the corresponding substrates 204 and 208. In some implementations, the first AW resonator circuit 202 and the second AW resonator circuit 206 can each refer to electrode structures of a resonator circuit, where each electrode structure is positioned relative to a piezoelectric material. The piezoelectric material may be used as a surface for the electrode structures of the AW resonator circuits 202 and 206, and the piezoelectric material may, in various aspects, either be part of the AW resonator circuit 202 or 206 or part of the corresponding substrate 204, 208.

As shown in FIG. 2A, the AW filter package 200 includes a first AW resonator circuit 202 on a first substrate 204 and a second AW resonator circuit 206 on a second substrate 208. The first AW resonator circuit 202 is stacked above the second AW resonator circuit 206 in the vertical direction (e.g., the z-axis direction). The first AW resonator circuit 202 and second AW resonator circuit 206 are referred to herein collectively as "resonator circuits 202, 206"). The first AW resonator circuit 202 and the second AW resonator circuit 206 can each correspond to the AW circuits in FIGS. 1A-1C but may also be any other type or configuration of an AW filter circuit (e.g., separate or shared filter structures, such as the filter illustrated in FIG. 10). Therefore, details of the first AW resonator circuit 202 and the second AW resonator circuit 206 (e.g., the particular AW resonator couplings to form a given filter) are not shown in FIG. 2A or 2B. The resonator circuits 202, 206 include first metal interconnects (as discussed above in FIGS. 1A-1C) for receiving input RF signals from an external circuit (e.g., antenna) and providing filtered RF signals as an output to an external circuit along a signal path that includes filtering provided by the connections of the AW resonators and other circuit elements.

In the AW filter package 200 in FIG. 2A, the first AW resonator circuit 202 is disposed on a first surface 212 of the first substrate 204. For example, the first substrate 204 may be formed of a semiconductor material (e.g., silicon) formed in wafers to take advantage of advances and the low cost of semiconductor processing techniques, with resonators placed on a piezoelectric material. The second surface 214 is opposite to the first surface 212. With the orientation of the AW filter package 200 shown in FIG. 2A, the first surface 212 can also be referred to as a top surface 212, and the second surface 214 can also be referred to as a bottom surface 214 of the first substrate 204 because the top surface 212 is disposed above the bottom surface 214 in the vertical direction (Z-axis direction).

The second AW resonator circuit 206 is disposed in or on a third surface 216 of the second substrate 208. The first substrate 204 is stacked on the second substrate 208 in the AW filter package 200 to reduce the area occupied by AW filter circuits on the first and second substrates 204, 208. The second substrate 208 (e.g., when a carrier material) may also be formed of a semiconductor material (e.g., silicon) formed in wafers, for example, to take advantage of advances and the low cost of semiconductor processing techniques, with AW resonators placed on a piezoelectric material as mentioned above. In this regard, the first substrate 204 may be stacked on (e.g., above in the vertical, Z-axis direction) the second substrate 208, or the second substrate 208 may be stacked on (e.g., below in the vertical, Z-axis direction) the first substrate 204. A frame 218 is disposed between the second surface 214 of the first substrate 204 and the surface 216 of the second substrate 208. The frame 218 may be polymer support structures configured around the edges of the substrates 204 and 208, with the frame creating a cavity 220 where AW resonators and other circuitry are positioned. The polymer elements are structured to prevent the AW resonator circuits or other elements in the cavity (e.g., the AW resonator circuit 206) from coming into contact with the substrate at the top of the corresponding cavity. The frame 218 can both provide mechanical support for the relative positioning of the first substrate 204 and the second substrate 208, and provide structural protection within the cavity 220 for elements (e.g., the AV resonators) within the cavity 220. The second AW resonator circuit 206 is disposed in the cavity 220 between the bottom surface 214 of the first substrate 204 and the top surface 216 of the second substrate 208. The cavity 220 may also include air or gas.

The AW filter package 200 in FIG. 2A also includes a cap substrate 222 disposed on the first surface 212 of the first substrate 204. The cap substrate 222 is separated from the first surface 212 by a frame 218 to form a cavity 226 in which the first AW resonator circuit 202 is disposed. The cap substrate 222 provides a cap to the cavity 226 in the manner that the first substrate 204 provides a cap to the cavity 220. The cavity 226 also includes air or another gas around the first AW resonator circuit 202. The cap substrate 222 may be glass, for example, or another non-conductive substrate material. The stacked AW filter package 200 also includes contacts 228A, 228B (e.g., shown in FIG. 2B), which are disposed on metal interconnects 230A, 230B on a contact surface 232 of the cap substrate 222 for connecting the second AW resonator circuit 206 to external circuits. The contacts 228A, 228B are coupled to the second AW resonator circuit 206 by the metal interconnects 230A, 230B formed in a metallization (redistribution) layer 236. The metallization layer 236 extends from the contact surface 232 onto a side surface 238 of the cap substrate 222 and onto a side surface 240 of the first substrate 204. The side surface 240 extends between the first surface 212 and the second surface 214 of the first substrate 204. Additional contacts (not shown) may be disposed on the contact surface 232 for connecting the first AW resonator circuit 202 to external circuits (e.g., processing circuitry, antennas, etc.).

In the stacked AW filter package 200 in FIG. 2A, the first AW resonator circuit 202 may filter a first RF signal while the second AW resonator circuit 206 filters another RF signal. In other aspects, the first AW resonator circuit 202 and the second AW resonator circuit 206 may filter the same signal (e.g., with resonators in the same ladder network). Additionally, as described above, each AW resonator circuit 202, 206 may include one or more resonators connected in one or more filter circuits depending on a device configuration to filter RF signals in a communication apparatus. In some examples, the resonator circuits 202, 206 are not electrically associated with each other in operation, but in other examples, the resonator circuits 202, 206 may both be coupled to a same antenna, not shown, coupled to the AW filter package 200. Thus, the resonator circuits 202, 206 may provide different filters for a same RF signal or may filter different RF signals.

In various implementations due to design factors (e.g., due to device size constraints), the resonator circuits 202, 206 may be in close proximity to each other or to other AW resonators or other circuit elements in the AW filter package 200 such that the noise generated from bulk waves in the first AW resonator circuit 202 can interfere with the operation of the first AW resonator circuit 202 and the operation of the second AW resonator circuit 206. Similarly, the noise generated in the second AW resonator circuit 206 can interfere with itself and with signals of the first AW resonator circuit 202. Such noise from reflected bulk wave may have impacts may be greater when the first AW resonator circuit 202 and the second AW resonator circuit 206 are coupled to the same antenna. As described further below with respect to FIG. 5, in some aspects, a design can be created with certain AW resonators or resonator circuits positioned with expected amounts of noise from reflected bulk waves. Dampening structures described herein can be used as needed to meet performance targets, and not used even when reflected bulk waves are present if the amount of noise does not cause a design to fall short of performance targets.

As described herein, portions of frame 218, additional supporting walls 224, or other such support structures can be used not only for mechanical stability and support, but also for dampening reflected bulk waves. Further, in some elements, such support element can be combined with additional dampening layers such as polymer or metallic dampening layers that can attenuate reflected bulk waves. In other aspects described further below, a uniform or structured polymer or metal layer can be used in addition to dampening from supporting frame structures such as the frame 218 or walls 224. In some aspects, a metal layer is included to operate as an electromagnetic shield (e.g., a Faraday shield) and to block propagation of the reflected bulk waves (e.g., the interfering signal which creates noise) between adjacent circuits.

FIG. 2B is a perspective view of the AW filter package 200 shown in FIG. 2A. FIG. 2B is provided to more clearly illustrate certain aspects of the AW filter package 200, in particular, the conductive (e.g., metal) interconnects 230A, 230B on the side surface 240 of the first substrate 204. Additionally, while FIGS. 3 and 4 below illustrate side-view perspectives of AW filter packages, the details of FIGS. 2A-B may apply to the configurations of FIGS. 3 and 4, with the described adjustments to the positioning of the electroacoustic resonators and the dampening structures discussed below integrated with the additional details described in FIGS. 2A-2B. As shown in this non-limiting example, the metal interconnect 230A extends from the contact 228A and is disposed on the side surface 238 of the cap substrate 222, onto the frame 218, onto the first surface 212 of the first substrate 204, and can be coupled to a portion 244 of a signal path used to create filters with the AW resonators (e.g., the resonator circuits 202, 206). The metal interconnect 230A couples a ground or a portion of the signal path to a corresponding element of a circuit (e.g., the second AW resonator circuit 206 to the contact 228A). For example, the contact 228A may receive a supply of the ground voltage Vss from an external circuit in a mobile device. The metal interconnect 230B extends from the contact 228B and is disposed on the side surface 238 of the cap substrate 222, the insulation layer 248, the frame 218, and the signal pad 246. The metal interconnect 230B couples the signal pad 246 of the AW resonator circuit 206 to the contact 228B, which may be coupled to at least one of the first AW resonator circuit 202 and an external circuit.

Figure 3:
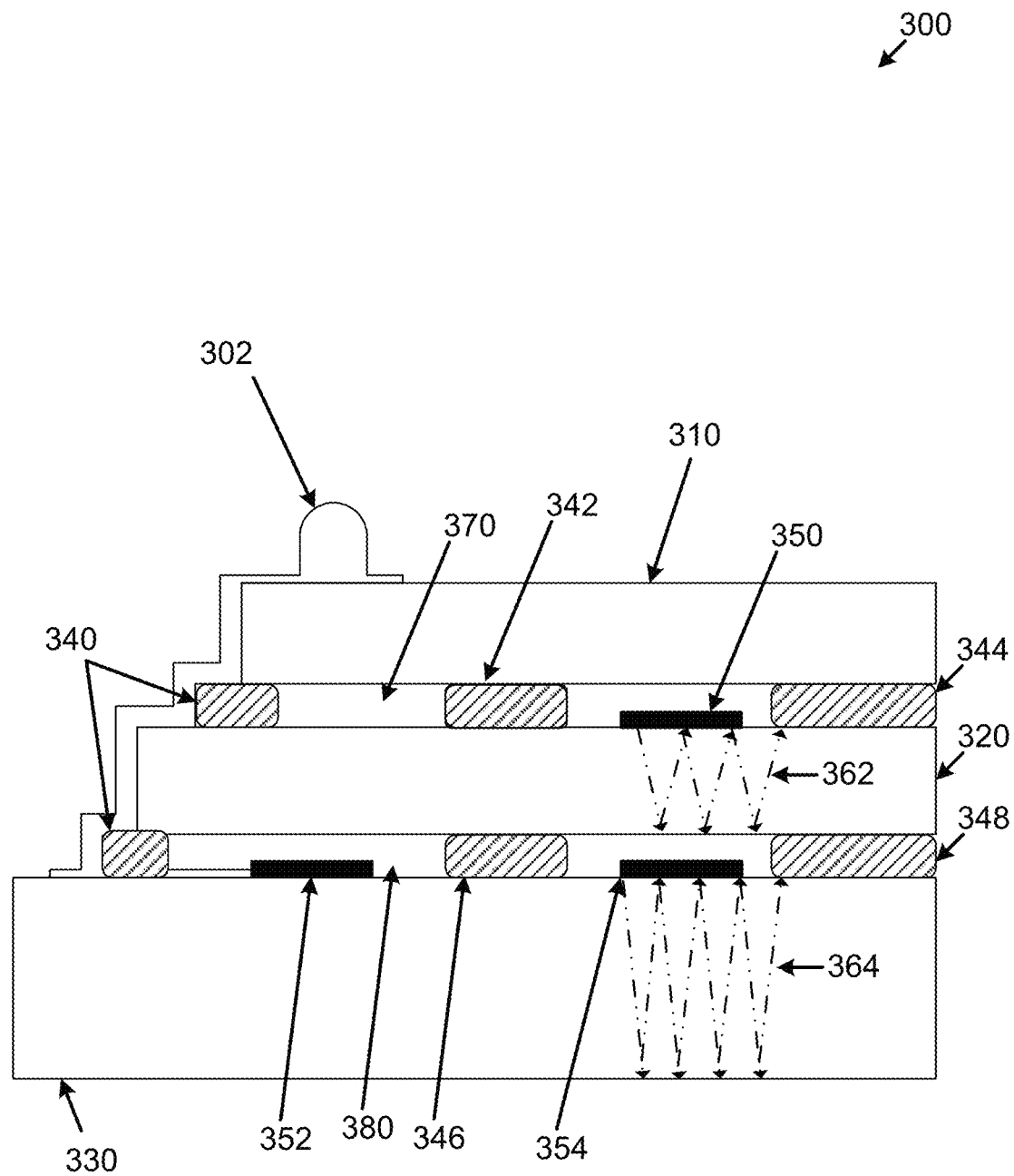
FIG. 3 is a cross-section side view of some elements of a stacked AW filter package illustrating reflected bulk waves that can occur within the stacked AW filter package in accordance with aspects described herein.

FIG. 3 is a cross-section side view of some elements of a stacked AW filter package 300 illustrating reflected bulk waves (e.g., bulk waves 362 and 364) that can occur within the stacked AW filter package 300 in accordance with aspects described herein. The cross-section of FIG. 3 illustrates an edge portion of the stacked AW filter package 300 on the left, and a central portion on the right that can continue with additional AW resonator circuits and walls, as illustrated below in FIG. 5. While an upper cavity 370 is shown as only having a single AW resonator circuit 350, and a lower cavity 380 is shown as having two AW resonator circuits 352 and 354, the complete stack layer which is not shown can have additional AW resonator circuits at different positions that are not shown (e.g., either at different depth slices, or further along the slice to the right in a section of the stacked AW filter package 300 that is not shown.) As indicated above, the AW resonator circuits 350, 352, and 354 include electrode structures similar to those described in FIGS. 1A, 1B, and 1C. In various implementations, the AW resonator circuits 350, 352, and 354 may either include a piezoelectric surface that the corresponding electrode structures are positioned on, or the electrode structures may be positioned on a piezoelectric layer that is part of the corresponding substrate for each AW resonator circuit 350, 352, 354 (e.g., the substrates 320 and 330). Additionally, in some implementations, each AW resonator circuitry 350, 352, 354 may include electrode structures for multiple SAW resonators, along with internal and external signal connections associated with the particular configuration of the SAW resonators for an associated AW filter.

The portion of the stacked AW filter package 300 shown in FIG. 3 is simplified compared to the detail of FIGS. 2A and 2B, but can include the additional elements described above, or other elements as part of an integration with other elements of an apparatus. The illustration of FIG. 3 includes two stacked substrates (e.g., a first substrate 320 and a second substrate 330), with a third cap substrate (e.g., a cap substrate 310) on top. The cap substrate 310 has a connector 302 positioned on a top surface, with electrical connections running down a side of the stacked AW filter package 300 to allow electrical connections to the AW resonator circuit 352. As shown in FIG. 2B, other portions of the stacked AW filter package 300 can have additional connections that have electrical paths connecting them to different AW resonator circuits. The first substrate 320 has a first AW resonator circuit 350 mounted to a first (e.g., top) surface, as well as multiple polymer elements 340, 342, and 344. As detailed further below, the polymer elements can be part of a frame structure (e.g., elements 340) that support stack layer connections at edges of the substrates. Other such polymer elements can be walls that extend into a central area from edge frame structures. Still other polymer elements can be "islands" that float between two substrates with no connection to other polymer wall or frame elements. The supporting elements are referred to as polymer elements, polymer walls, and/or polymer frames, but can be any suitable substance or structure in other designs that provide the benefits described herein. These polymer elements provide mechanical support for a cavity 370 between the cap substrate 310 and the first substrate 320, where the first AW resonator circuit 350 resides. The first AW resonator circuit 350 sits disposed on the first surface of the first substrate 320, and does not touch the cap substrate 310. The cap substrate is held above the first AW resonator circuit by the polymer elements (e.g., frame element 340 and wall elements 342 and 344).

In addition to the first substrate 320, a second substrate 330 is present. AW resonator circuits 352 and 354 are on a first (e.g., top) surface of the second substrate 330, within a second cavity 380 supported by polymer elements 340, 346, and 348 that are also on the top surface of the second substrate 330. The first substrate 320 is part of an internal stack layer with the top and bottom surfaces of the first substrate 320 not having significant exposure to an outside of the stacked AW filter package 300. As described above, this limits the exposure to possible acoustic dampening structures (e.g., mold structures, which are not shown), which can, for example, surround the illustrated portions of the stacked AW filter package 300 or providing covering for at least a portion of an exterior stack substrate to provide dampening for reflected bulk waves such as reflected bulk waves 364 in the second substrate 330.

Figure 6:
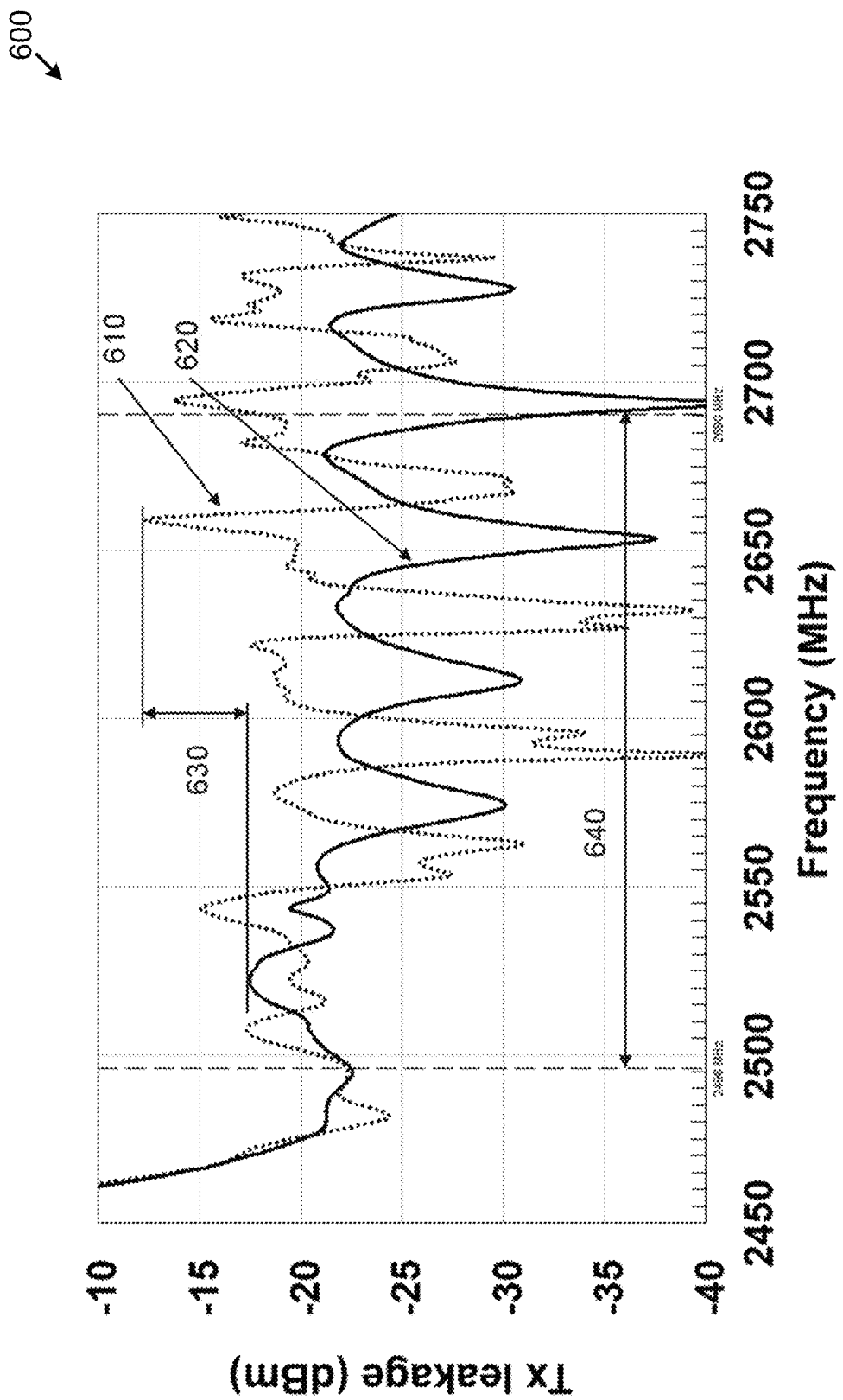
FIG. 6 is a chart of transmission signal leakage associated with reflected bulk waves in a stacked AW filter, illustrating reduced excitation of the reflected bulk waves in a selected communication band in accordance with aspects described herein.

The illustrated structures implementing surface acoustic wave (SAW) filters include wave modes which are concentrated at the surface of the piezoelectric substrate as described above with respect to FIGS. 1A-1C. Such resonators also include unintended bulk wave propagation outside of the surface of the piezoelectric substrate. Such waves can propagate into the bulk of the piezoelectric material and the substrate supporting the illustrated resonator elements (e.g., acoustic signals entering a substrate from a resonator element such as the IDT 105, etc.) Propagation into the substrate is a parasitic effect which deteriorates the overall filter performance (e.g., by increased losses in carrier aggregation counter bands, higher signal leakage as illustrated in FIG. 6, etc.) Such bulk waves can further reflect off of the back side of a substrate, and propagate through repeated reflections to other portions of a circuit where other electroacoustic transducers are located. Although each reflection can reduce the strength of the bulk wave, certain designs can be sensitive to such bulk waves being sensed by other transducers, and the bulk waves cause cross-talk and noise when the bulk waves are sensed by such transducers and converted back from mechanical (e.g., acoustic) vibrations into electrical signals. These electrical signals are superimposed on the desired filter characteristics of the filter including the receiving transducer, and appear as unwanted signatures in the transmission characteristics of a given filter (e.g., as spikes above the passband frequencies, or additional signal leakage). For larger (e.g., longer) AW resonators, the effect becomes more pronounced due to the likelihood that a volume wave is reflected back to the acoustically active area within a single transducer (e.g., as opposed to shorter transducers). Certain SAW transducers consist of many sub-transducers, which result in a large active area that is susceptible to the unwanted bulk reflected signals.

FIG. 3 additionally shows reflected bulk waves 362 and reflected bulk waves 364. As described above in FIGS. 1A-C, the AW resonator circuits 350, 352, and 354 include transducers that resonate as electroacoustic devices. Such resonances do not strictly stay within a stack plane (e.g., at a surface of a substrate with defined electrical pathways), but include some resonances which transmit acoustic (e.g., mechanical) energy into bulk transmission pathways as shown. While bulk waves 362 and 364 are shown close to the AW resonator circuits that create them (e.g., the AW resonator circuit 350 creating the reflected bulk waves 362 and the AW resonator circuit 354 creating the reflected bulk waves 364), such waves continue throughout the substrates, even as they dissipate. As detailed above, each of the AW resonator circuits 350, 352, 354 may include multiple transducers, and bulk reflections bouncing back to the AW resonator circuits from the back side of the substrate that the circuit is mounted on may degrade performance. Whether the amount of energy from the reflected bulk wave 364 impacts device performance depends on how the signal dissipates, as well as how strong it is. As mentioned above, the reflected bulk wave 364 at the exterior stack layer can be dissipated by mechanical dampening from a mold structure or other dampening material at the second (e.g., bottom) surface of the second substrate 330. Such dampening material can be $SiO_2$, other such polymer materials, or other materials selected for dampening characteristics. The reflected bulk wave 362, however, does not have any exposure to such a surrounding mold structure or any other such dampening structure, but can reflect off the surfaces (e.g., the bottom surface of the substrate 320) that create or enclose the first cavity 370 and the second cavity 380. Such cavities are unlikely to provide much dampening, and so the reflected bulk wave 362 in the middle layer of the stack will propagate further, and have greater energy when it is received in an unwanted active location of any resonator circuit. Even so, in some structures, the undampened reflected bulk wave 362 may not impact performance, either due to the distance to a susceptible AW resonator circuit being far enough away that the energy dissipates sufficiently without added dampening, or because the circuit design is resilient to such cross-talk. Other designs, however, may have greater performance limitations (e.g., greater sensitivity targets), or other related criteria that demand less cross-talk from such an mid-layer reflected bulk wave in a stack.

If an electroacoustic filter is part of a multiplexer and these parasitic modes appear in the frequency range of any carrier-aggregation counter bands, the performance of the counter bands deteriorate and isolation, attenuation, or leakage performance targets may be impacted. If a mold material or any other such dampening material is applied to the backside of the substrate material for encapsulation, the excitation of the reflected bulk waves can be reduced by a mechanical damping effect. For example, this can be observed for electroacoustic SAW filters in combination with thin-film acoustic packages (TFAP), where the mold material is in direct contact with the backside of the substrate material. Aspects described herein can include backend technologies where there are two or more substrates, each containing one or more electro-acoustic filters, which are vertically stacked on top of each other, reflections of bulk waves will occur for all filters on all of the stacked substrates. However, in a molded environment only the backside of the bottom substrate (e.g., the second substrate 330) would be in direct mechanical contact with the mold material and the backside of the other substrates (e.g., the first substrate 320) do not have any contact to the mold material. Consequently, the spurious wave modes, which are excited due to reflected bulk waves, are only reduced for the bottom substrate which is in contact with a mold material. In some implementations, a structural element such as a mold material may initially be designed without consideration for dampening effects. Subsequent design modifications with reflected bulk wave impact on device performance can result in adjustment of the mold material placement, adjustment of the material type to a different dampening material based on dampening characteristics, or addition of additional dampening structures. In some aspects, a design may not include a mold material for encapsulation, and a dampening material can be added to improve device performance by reducing degradation from reflected bulk waves as described herein.

Figure 4A:
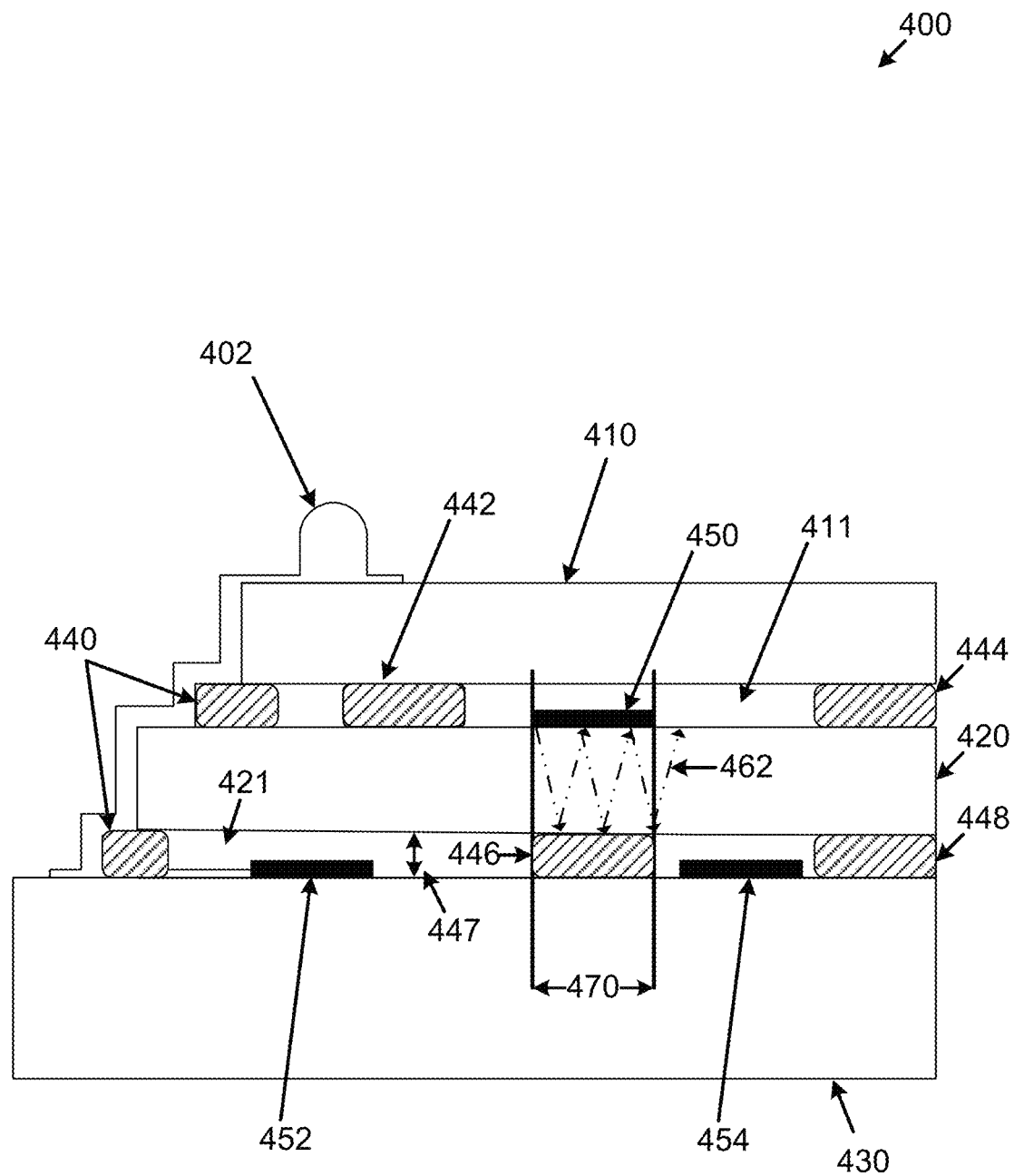
FIG. 4A is a cross-section side view of some elements of a stacked AW filter package modified to reduce excitation of reflected bulk waves that can occur within the stacked AW filter package in accordance with aspects described herein.

FIG. 4A is a cross-section side view of some elements of a stacked AW filter package 400 modified to reduce excitation of reflected bulk waves that can occur within the stacked AW filter package 400 in accordance with aspects described herein. FIG. 4A includes corresponding elements to those described in FIG. 3. The illustrated elements include a cap substrate 410, a first substrate 420, and a second substrate 430. The cap substrate 410 supports connection 402. The first substrate 420 and the cap substrate 410 are separated by a first cavity 411 created by polymer elements, including a frame element 440, and wall elements 442 and 444. A first AW resonator circuit 450 is positioned on a top surface of the first substrate 420, and in the first cavity 411. The first substrate 420 and the second substrate 430 are separated by polymer elements 440, 446, and 448 (e.g., with a thickness 447 that creates the cavity 421 having the thickness 447 determined by the corresponding thickness of the polymer elements that provide mechanical stability for the cavity as part of a structural support for the substrate position) that create a second cavity 421, with two AW resonator circuits 452 and 454 in the second cavity 421 and on the top surface of the second substrate 430. While the cavities shown have relatively constant thickness, various implementations can involve substrates with varying geometries and different cavity thicknesses associated with different polymer elements at different positions within the same cavity.

Compared with the stacked AW filter package 300 of FIG. 3, however, the polymer element 442 and the first AW resonator circuit 450 are shifted to the left, and the polymer element 446 is aligned opposite the first AW resonator circuit 450. The opposite alignment refers to the positioning 470 of the first AW resonator circuit 450 directly through the structure of the first substrate 420 to the position of the polymer element 446 on the opposite surface of the first substrate 420. The positioning 470 of the first AW resonator circuit 450 opposite the polymer element 446 results in the reflected bulk wave 462 having a greatest energy at the positions in the first substrate 420 where it reflects off the interface at the second (e.g., bottom) surface of the first substrate 420 where the interface is with the polymer element 446 instead of with air or gas filled portions of the cavity 421. Such a position 470 of the polymer element 446 leads to full or partial absorption of the energy of the bulk wave by the polymer element 446, which acts as a mechanical damping layer. As a consequence, the energy of the reflected bulk wave 462, which propagates to other portions of the first substrate 420 (in the same or other AW resonators) where it can create cross-talk and interference, is reduced.

The structure of the stacked AW filter package 400 can, in some implementations, be described as including an electrode structure in the AW resonator circuits 450, 452, 454 with the electrode structures positioned in an x-y plane (e.g., approximately parallel to the planar surface of the substrates 420 and 430.) The resonators are configured to generate an acoustic wave as part of a signal path having a direction in the x-y plane via the electrode structures. An unintentional bulk acoustic wave can be generated by the AW resonator circuits that has a z-directional component (e.g., out of the x-y plane including the electrode structures, and into a substrate that supports the electrode structures). The unintentional bulk acoustic wave with the z-directional component (e.g., in addition to any x or y directional component) can reflect off of a back-side of a substrate, and interfere with AW components (e.g., the AW resonator that generates the bulk wave, or another AW resonator within the stacked AW filter package 400). In order to suppress such bulk waves, the back-side of the substrate where the bulk wave acoustic reflection occurs can be configured with a polymer, metal, or other material interface to suppress the acoustic reflection of the bulk wave (e.g., the acoustic wave with the z-directional component). Such a dampening material can be positioned in the x-y plane offset in the z-direction from the AW resonator that generates the bulk acoustic wave, at a portion of the back-side surface of the substrate where the reflections occur. In other implementations, any interface shape between the back-side of the substrate and a dampening material (e.g., polymer, metal, etc.) that dampens the reflection of the bulk acoustic wave can be used. Such a dampening material may additionally provide structural (e.g., mechanical) stability or other support to the substrate, or may be positioned for acoustic reflection dampening without providing structural support.

Figure 4B:
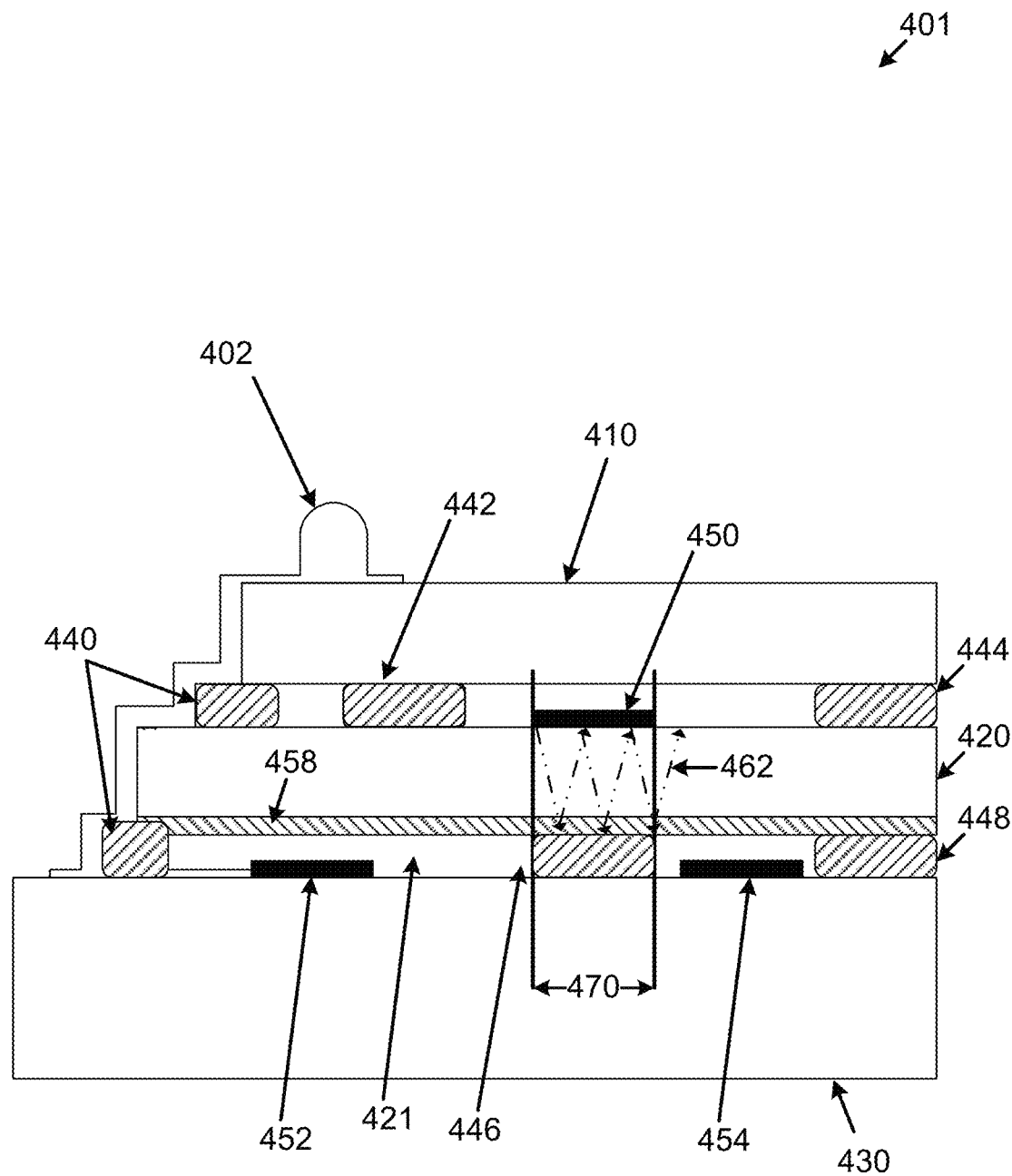
FIG. 4B is a cross-section side view of some elements of another stacked AW filter package modified to reduce excitation of reflected bulk waves that can occur within the stacked AW filter package in accordance with aspects described herein.

FIG. 4B is a cross-section side view of some elements of another stacked AW filter package 401 modified to reduce excitation of reflected bulk waves that can occur within the stacked AW filter package 401 in accordance with aspects described herein. The only difference between the structure of FIG. 4B and the AW filter package 401 with the AW filter package 400 of FIG. 4A is the uniform polymer layer 458. Such a uniform polymer layer 458 can be fabricated as part of the stacked AW filter package 401 using the same process as the structural polymer elements 440, 446, and 448. The structural elements are described in FIGS. 4A and 4B as being polymer elements. In other implementations, such elements can be metallic or part of a metal layer. The addition of the uniform polymer layer 458 at the bottom surface of the first substrate can provide increased dampening to weaken the reflected bulk wave 462, compared with reflections off of an interface with the air or gas of the cavity 421. Aspects with such an element can leverage the in-place fabrication processes to add a small amount of additional material at the bottom surface of the first substrate to reduce cross-talk at a small cost of size (e.g., increased thickness) and material (e.g., increased mass). Additionally, while FIG. 4B illustrates the use of a shared polymer material and process, some implementations can use different materials to increase the dampening, or for differing electrical characteristics.

FIG. 4B shows a uniform polymer layer together with the re-aligned polymer wall. In some implementations, if uniform polymer layer is applied, the re-alignment of the polymer element with the resonator structure might not be used, resulting in a uniform polymer layer without realignment of the polymer element for suppression of acoustic bulk waves, as illustrated in FIG. 3.

The design of the polymer frame structure to include consideration of dampening of reflected bulk waves can thus further be used for additional mechanical stability along with dampening from alignment of an AW resonator circuit with a polymer element. Such a dampening can function for an interior stack substrate similar to the dampening the exterior substrate receives from the molding material or other dampening material as described above. While alignment of polymer walls provides superior mechanical stability, aspects described herein can provide sufficient stability while providing dampening for the internal stack layer AW resonator circuits. Minor positioning shifts of a given design to readjust locations of dedicated polymer walls can provide a low-cost design adjustment that provides performance improvements to reduce the excitation of reflected bulk waves. Additionally, by targeting movement of polymer walls to device elements with key impacts on device performance, and leaving other polymer walls positioned for stability (e.g., aligned with other polymer walls instead of with AW resonator circuits for dampening), mechanical stability targets can be maintained while improving electrical performance. Additionally, in some aspects, additional walls (e.g., polymer, uniform metal layer, etc.) may be newly added if shifting other polymer walls to a position underneath an AW resonator (e.g., or to any position to suppress acoustic bulk wave reflections) degrades mechanical stability.

Aspects described herein can thus improve electrical performance of a stacked AW filter package characteristics such as attenuation, isolation, and transmission leakage in counter bands while maintaining mechanical stability. Such electrical performance parameters received benefits without corresponding electrical performance trade-offs, so that such polymer wall adjustments can be made without concern for a corresponding degradation in another portion of the electrical design. Additionally, because such an approach is size-neutral in terms of the exterior package, and may use an in-place fabrication process (e.g., changing wall positions as illustrated in FIG. 4A uses existing processes, while additional layers as illustrated in FIG. 4B use new fabrication steps), the electrical performance can be improved with minimal impact on fabrication resource usage (e.g., cost).

Figure 5:
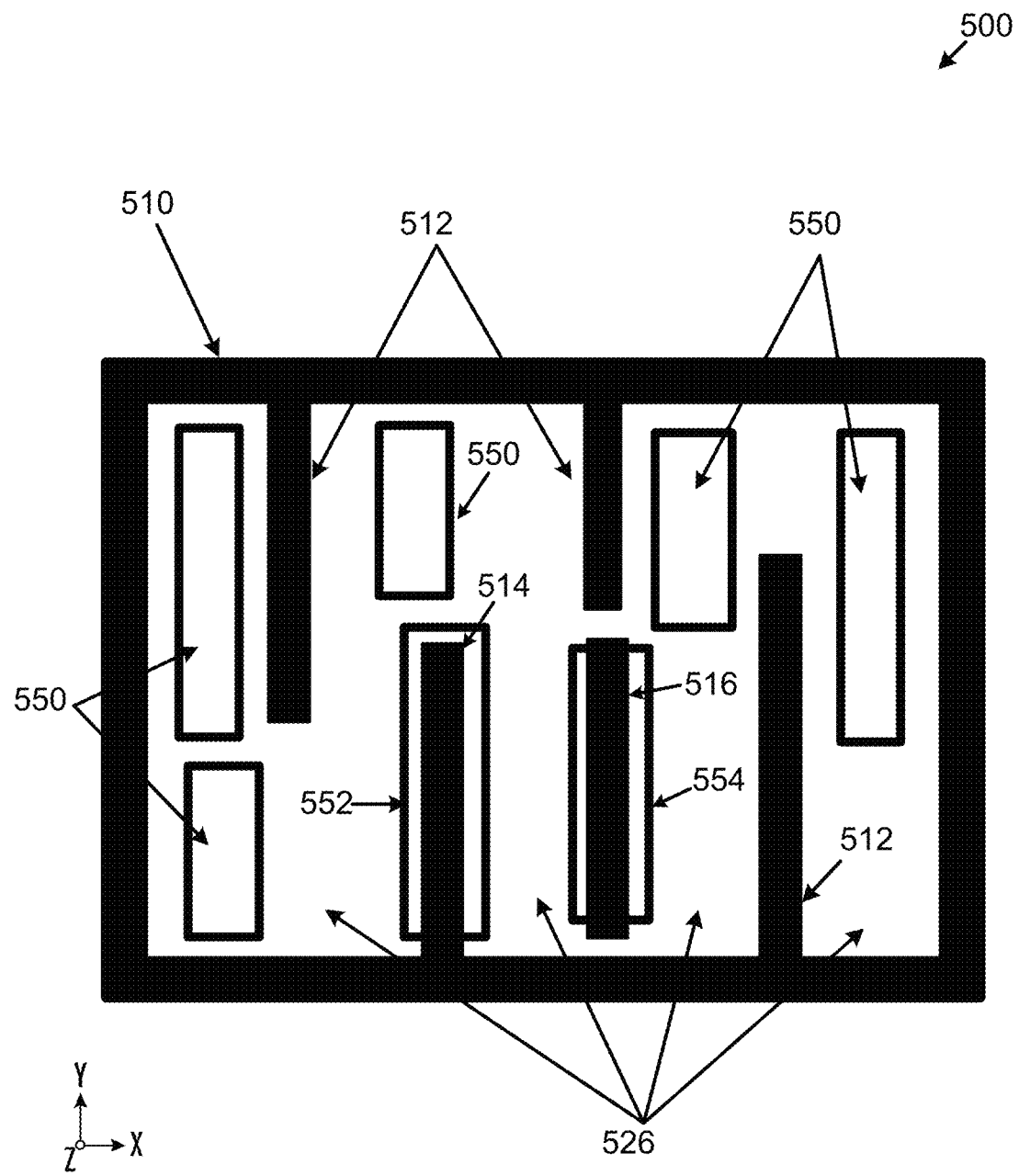
FIG. 5 is a top-down view showing multiple layers of a stacked AW filter configured to reduce excitation of reflected bulk waves in accordance with various aspects described herein.

FIG. 5 is a top-down view showing multiple layers of a stacked AW filter package 500 configured to reduce excitation of reflected bulk waves in accordance with various aspects described herein. As mentioned above, the previous illustrations have been side view cut-out illustrations. Each of the FIGS. 2A-B, 3, 4, and 5 have a shared directional indicator, with the planes of the substrate stacks in constant Y-X planes, and the cross-section views of FIGS. 2A, 3, and 4 in X-Z planes. FIG. 5 shows a top down view in an X-Y plane, with AW resonator circuits 550, 552, and 554 mounted on a top surface of a first substrate (not shown, similar to the first substrates 320 and 420), multiple different types of polymer elements one a top surface of a second substrate (e.g., similar to the substrates 330 and 430 shown in black, and the cavity 526 making up the space around the polymer elements and the AW resonator circuits 550. As shown, the polymer elements include frame element 510 that makes up a bordering edge of the cavity 526. Polymer walls 512 and 514 extend from the frame element 510, providing additional mechanical stability. In various implementations, polymer walls 512 and 514 can be implemented as elements which may not be considered "walls", and which may not be polymer. In some implementations, elements of a uniform or structured metal layer may be used in place of polymer walls 512 and 514. In some implementations, polymer walls 512 and 514 may be implemented as non-structural polymer or metal elements within an AW resonator.

In addition to providing mechanical support in the cavity 526 gap, the polymer wall 514 is positioned opposite the AW resonator circuit 552 which overlaps with the polymer wall 514 from the top-down perspective (e.g., a projection of the AW resonator circuit 552 or an IDT of the AW resonator circuit onto the back surface of the substrate overlaps with the interface/coupling area of the polymer wall 514 and the substrate). The overlap represents the positioning of the polymer wall 514 on the bottom surface if the first substrate, opposite the AW resonator circuit 552 on the top surface of the first substrate. The position of the polymer wall 514 provides dampening for reflected bulk waves launched into the first substrate by the AW resonator circuit 552. Polymer island 516 provides similar dampening for reflected bulk waves from the AW resonator circuit 554.

As shown, only the AW resonator circuits 552 and 554 are aligned opposite polymer elements (e.g., the polymer wall 514 and the polymer island 516, respectively). Such a configuration may be a result of specific device performance criteria, where signals from the AW resonator circuits 552 and 554 cause interference with itself or other AW resonator circuits 550, 552, 554. AW resonator circuit 550 may generate similar reflected bulk waves which do not have any impact on performance criteria. Therefore, an apparatus may achieve performance targets without polymer elements such as elements of polymer wall 514 and polymer island 516 (e.g., which can be metal layers in other implementations). In some designs, where every AW resonator circuit 550, 552, and 554 has associated reflected bulk waves that cause performance issues, or in an initial conservative design where the additional polymer structures provided desired structural support, each of the AW resonator circuits 550 could have an associated polymer island or polymer wall to provide dampening. Similarly, the inclusion or exclusion of a thin uniform dampening layer or a partial thin dampening layer (e.g., similar to the layer 458 of FIG. 4B) over some or all of a bottom portion of the first substrate can be implemented based on performance of a specific design. While such a layer is not included in the stacked AW filter package 500, other implementations can use such a layer made of any suitable material.

Additionally, while the aspects described herein discuss a single center layer (e.g., the first substrate) in a three substrate stack, other implementations can use additional stacks, with each stack layer having dampening structures aligned with AW resonator circuits depending on the particular performance criteria of a given design and the particular fabrication processes for the design. Such stack adjustments may additionally be applied to the layer 458 (e.g., which may be polymer or metal).

FIG. 6 is a chart 600 showing transmission signal leakage associated with reflected bulk waves in a stacked AW filter package. The chart 600 illustrates the effect of reflected bulk waves in a communication counter band in terms of how much undesired signal is leaking into the counter band. The signal data 610 corresponds to a stacked AW filter package without backside damping. The signal data 620 corresponds to a stacked AW filter package with backside damping. The TX leakage in decibel-milliwatts (dBm) is charted across a communication band 640, with difference 630 illustrating the reduction in the leakage signal for the design with backside dampening compared to the design without backside dampening. As illustrated, the use of polymer elements, or any other material that leads to the reduction of the excitation of reflected bulk waves, positioned not only for support, but also for dampening of reflected bulk waves, can provide a reduction in Tx leakage and associated noise. During device design, different performance impacts at different frequencies can be tested to balance performance metrics against additional material mass, fabrication step, and mechanical support criteria.

FIG. 7 is a flowchart illustrating a method 700 (or process) of operation of the disclosed stacked AW filter (e.g., stacked AW filter package 400 of FIG. 4A and FIG. 4B, the stacked AW filter package 500 of FIG. 5, the stacked AW filter with the performance improvement illustrated by transmission (TX) leakage data 620 in the chart of FIG. 6, etc.) in accordance with examples described herein. The method 700 is described in the form of a set of blocks that specify operations that can be performed. However, operations are not necessarily limited to the order shown in FIG. 7 or described herein, as the operations may be implemented in alternative orders or in fully or partially overlapping manners. Also, more, fewer, and/or different operations may be implemented to perform the method 700, or an alternative approach. In some implementations, the method 700 can be implemented by control or processing circuitry of a wireless apparatus (e.g., electronic device 1102) configuring the operation of a stacked AW filter. In some implementations, the method 700 can be implemented as instructions stored in a non-transitory computer readable storage medium, that, when executed by one or more processors of an apparatus, cause the apparatus to perform the operation of the method 700.

At block 702, the method 700 includes operations for providing a signal at an interconnect of a stacked acoustic wave (AW) filter package, where the interconnect is positioned on a cap substrate. The signal can be provided in accordance with any aspect described herein, and can be a wireless communication signal as part of a wireless link (e.g., wireless link 1106 described below in FIG. 11).

At block 704, the method 700 includes operations for exciting an acoustic wave at a first AW resonator circuit positioned on a first substrate at a separate stack layer from the cap substrate, where the first AW resonator circuit is electrically coupled to the interconnect, and where the first AW resonator circuit is positioned within a first cavity supported by elements between the cap substrate and the first substrate. Such an AW resonator circuit can be a SAW resonator including an electrode structure as describe in accordance with aspects above (e.g., FIG. 1A, 1B, 1C, etc.)

At block 706, the method 700 includes operations for dampening bulk waves in the first substrate from the first AW resonator circuit using a reflection suppression element positioned at an opposite side of the first substrate from the first AW resonator circuit, where the reflection suppression element further is positioned to support a second cavity between the first substrate and a second substrate, and where the second substrate is at an additional separate stack layer from both the cap substrate and the first substrate.

Figure 8:
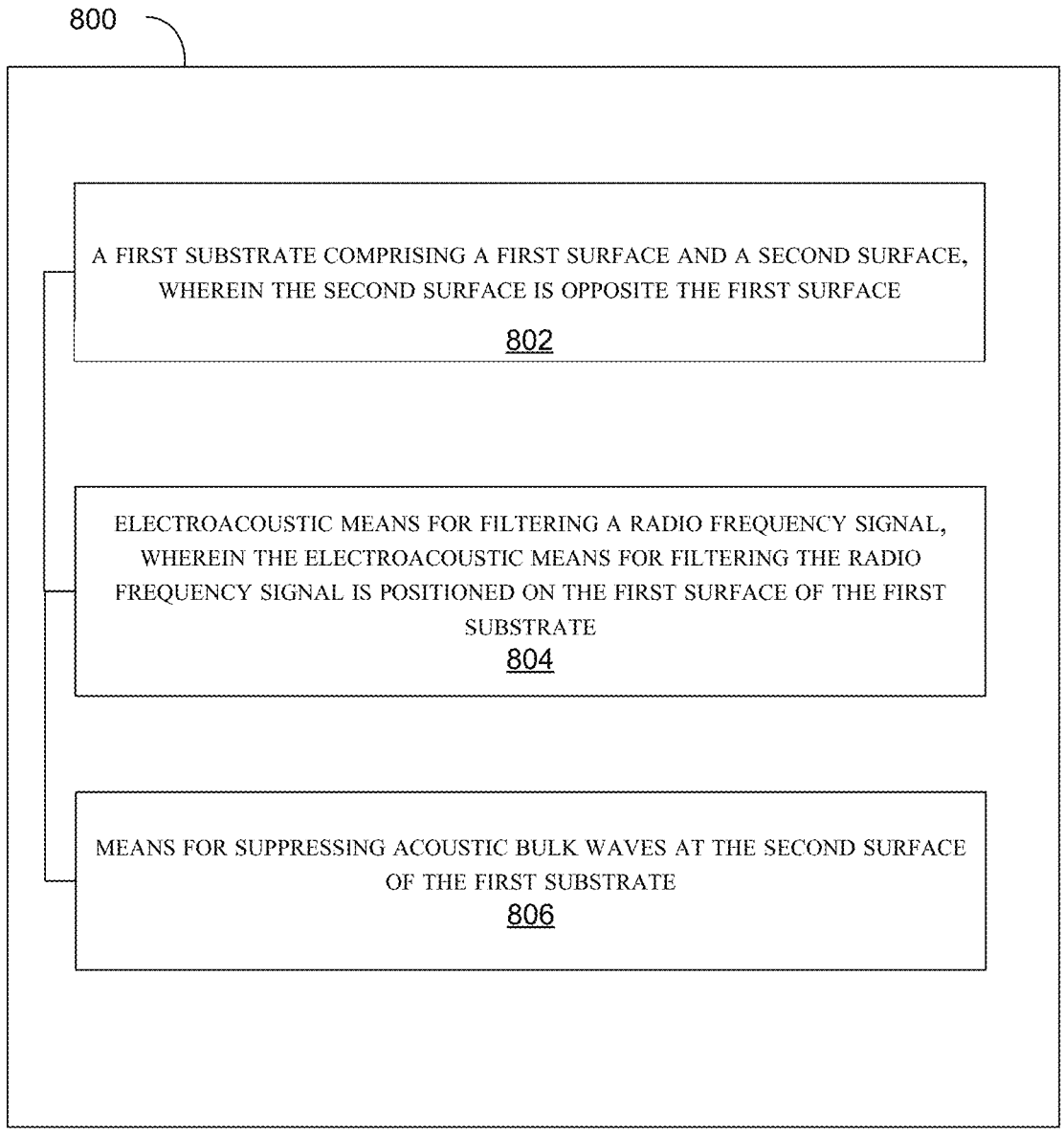
FIG. 8 is a functional block diagram describing elements of a stacked AW filter, in accordance with aspects described herein.

FIG. 8 is a functional block diagram of an apparatus 800 including a stack AW filter as described herein. The apparatus 800 comprises a first substrate 802 comprising a first surface and a second surface, wherein the second surface is opposite the first surface.

The apparatus 800 further includes electroacoustic means 804 for filtering a radio frequency signal, where the electroacoustic means for filtering the radio frequency signal is positioned on the first surface of the first substrate. Such electroacoustic means 804 can be configured in accordance with any aspect described herein.

The apparatus 800 further includes means 806 for suppressing acoustic bulk waves at the second surface of the first substrate. Such means 806 can be configured in accordance with any aspect described herein.

In some aspects, the means 806 can further be configured as means for providing mechanical stability or additional structural support to the first substrate 802.

Some aspects may further include means for transmitting and/or receiving the radio frequency signal, means for transmitting and/or receiving additional radio frequency signals, and means for processing radio frequency signals, including the radio frequency signal and the additional radio frequency signals.

Figure 9:
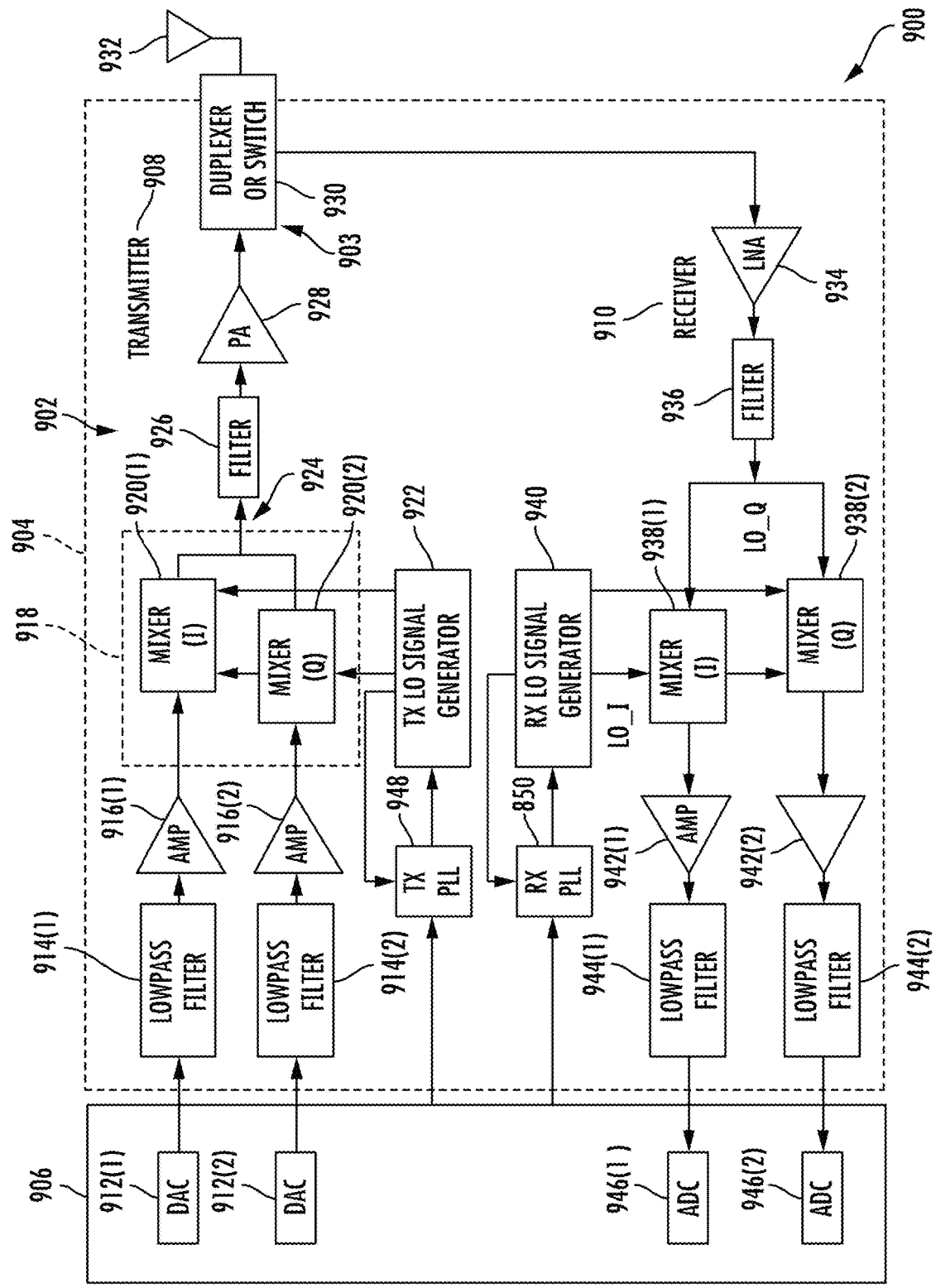
FIG. 9 is a block diagram of a wireless communication apparatus that includes a radio-frequency integrated circuit (RFIC), that includes a stacked AW filter in accordance with aspects described herein.

FIG. 9 illustrates a wireless communications device 900 that includes RF components formed from one or more ICs 902 and can include stacked AW filter packages 903. The stacked AW filter packages 903 include a first AW filter circuit disposed on a first substrate, a second AW filter circuit disposed on a second substrate, and an element (e.g., polymer or uniform metal) which can be structural or non-structural to suppress bulk acoustic wave reflections that can degrade performance as described herein. The wireless communications device 900 may include or be provided in any of the above-referenced devices as examples. As shown in FIG. 9, the wireless communications device 900 includes a transceiver 904 and a data processor 906 (e.g., processing circuitry). The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RFICs, mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a multiplexer or switch 930 and transmitted via an antenna 932 (e.g., where the multiplexer may be a duplexer or any other such multiplexing circuitry).

In the receive path, the antenna 932 receives signals transmitted by base stations and provides a received RF signal, which is routed through the multiplexer or switch 930 and provided to a low noise amplifier (LNA) 934. The multiplexer or switch 930 is designed to operate with a specific receive (RX)-to-TX multiplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Wireless communications devices 900 that can each include stacked AW filter packages 903. The stacked AW filter packages 903 include a first AW filter circuit disposed on a first substrate, a second AW filter circuit disposed on a second substrate, and a metal layer to isolate the first AW filter circuit from the second AW filter circuit to reduce cross-talk, as illustrated in FIGS. 2A-C, 3, 4, and, and according to any of the aspects disclosed herein, may be provided in or integrated into any processor-based device. As illustrated, the multiplexer or switch 930 may include a stacked AW component as described herein. In some implementations, the filters 926 and 936 may also include stacked AW components as described herein. In some such implementations, the filters 926, 936 may be positioned on the other side of the PA or LNA (e.g., along the signal path) from what is shown in FIG. 9. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
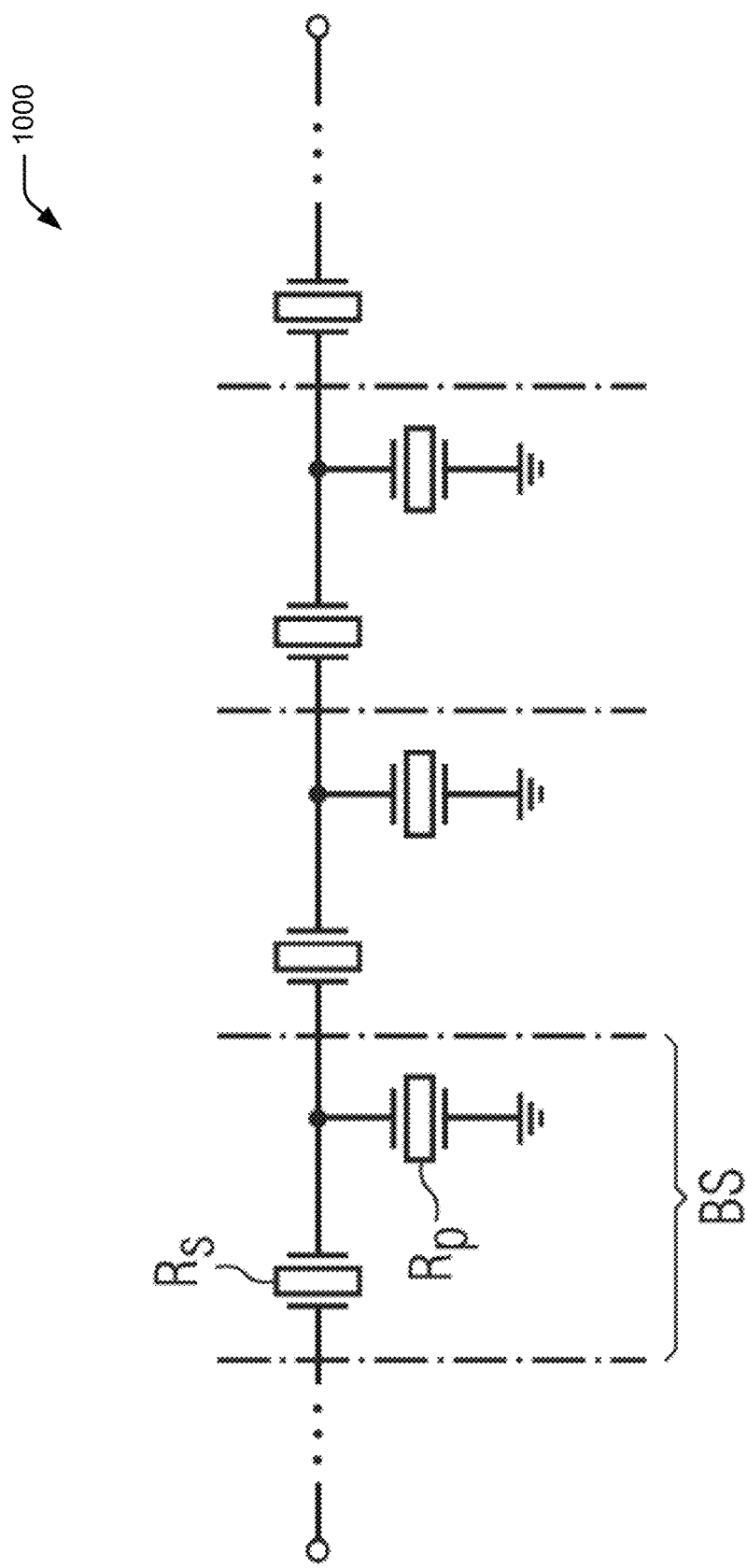
FIG. 10 is a schematic representation of a filter that may be implemented using a stacked AW filter in accordance with aspects described herein.

FIG. 10 is a schematic representation of a filter 1000 that may employ the disclosed stacked AW filter (e.g., stacked AW filter package 400 of FIG. 4A, the stacked AW filter package 500 of FIG. 5, the stacked AW filter with the performance improvement illustrated by transmission (TX) leakage data 620 in the chart of FIG. 6, etc.), in accordance with examples described herein. In particular, the filter 1000 comprises a ladder-type arrangement of acoustic SAW resonators Rs, Rp (where Rs are series resonators and Rp are parallel resonators). The disclosed stacked AW filter may couple SAW resonators (e.g., 450, 452, 454, etc.) to implement the filter 1000 while including the described elements for reducing excitation of bulk waves in the stacked AW filter used to implement the filter 1000.

The ladder-type structure of the filter 1000 comprises a plurality of basic sections BS. Each basic section BS comprises at least one series resonator Rs and at least one parallel resonator Rp. The basic sections BS may be connected together in series in a number of basic sections BS that is necessary to achieve a desired selectivity. Series resonators Rs that belong to neighbored basic sections BS may be combined to a common series resonator Rs, and parallel resonators Rp may also be combined if they are directly neighbored and belonging to different basic sections BS. One basic section BS provides a basic filter. More basic sections BS are added to provide for sufficient selectivity.

Figure 11:
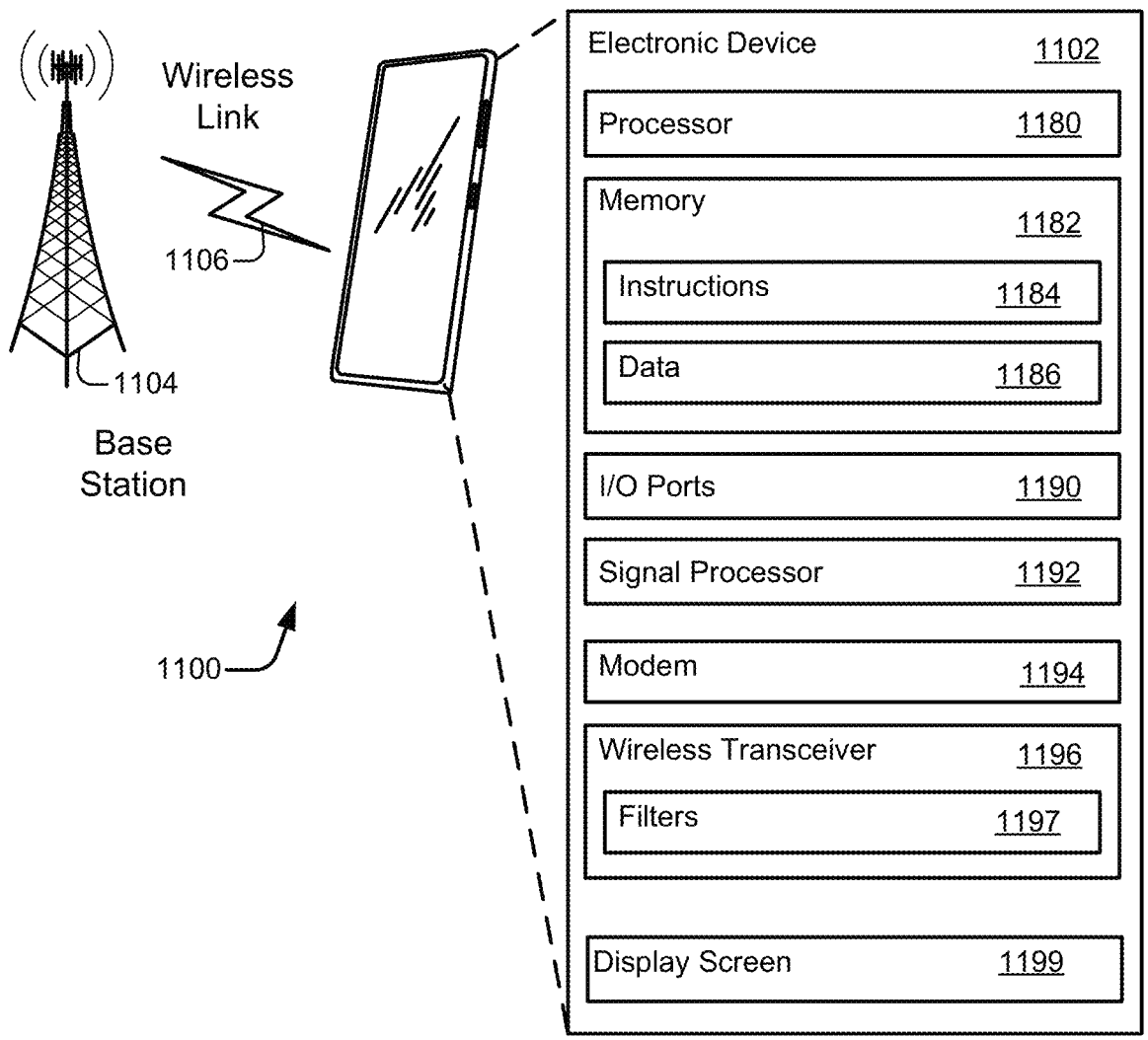
FIG. 11 is a diagram of an environment that includes an electronic device that includes filters that may be implemented using a stacked AW filter in accordance with examples described herein.

FIG. 11 is a diagram of an environment 1100 that includes an electronic device 1102 that includes a wireless transceiver 1196, such as the circuitry illustrated in FIG. 9. Further, as illustrated, the wireless transceiver 1196 can include filters 1197. The filters 1197 can be implemented as stacked AW filters as described herein (e.g., stacked AW filter package 400 of FIG. 4A, the stacked AW filter package 500 of FIG. 5, the stacked AW filter with the performance improvement illustrated by transmission (TX) leakage data 620 in the chart of FIG. 6, etc.) Additionally, while the electronic device 1102 is illustrated as having the wireless transceiver 1196 including the filters 1197, the base station 1104 can include similar wireless transceiver circuitry, implemented with stack AW filters as described herein.

In some aspects, the electronic device 1102 includes a display screen 1199 that can be used to display information associated with data transmitted via wireless link 1106 and processed using components of electronic device 1102 described below. Other aspects of an electronic device in accordance with aspects described herein using a low phase delay filter for multi-band communication can be configured without a display screen. In the environment 1100, the electronic device 1102 communicates with a base station 1104 through a wireless link 1106. As shown, the electronic device 1102 is depicted as a smart phone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, an automobile including a vehicle-based communication system, Internet of Things (IoT) device, sensor or security device, asset tracker, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, terrestrial broadcast tower, access point, peer to peer device, mesh network node, fiber optic line, another electronic device generally as described above, and so forth. Hence, the electronic device 1102 may communicate with the base station 1104 or another device via a wired connection, a wireless connection, or a combination thereof. The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1102 includes a processor 1180 and a memory 1182. The memory 1182 may be or form a portion of a computer readable storage medium. The processor 1180 may include any type of processor, such as an application processor or a multi-core processor, that is configured to execute processor-executable instructions (e.g., code) stored by the memory 1182. The memory 1182 may include any suitable type of data storage media, such as volatile memory (e.g., random access memory (RAM)), non-volatile memory (e.g., Flash memory), optical media, magnetic media (e.g., disk or tape), and so forth. In the context of the disclosure, the memory 1182 is implemented to store instructions 1184, data 1186, and other information of the electronic device 1102, and thus when configured as or part of a computer readable storage medium, the memory 1182 does not include transitory propagating signals or carrier waves.

The electronic device 1102 may also include input/output (I/O) ports 1190. The I/O ports 1190 enable data exchanges or interaction with other devices, networks, or users or between components of the device.

The electronic device 1102 may further include a signal processor (SP) 1192 (e.g., such as a digital signal processor (DSP)). The signal processor 1192 may function similar to the processor and may be capable executing instructions and/or processing information in conjunction with the memory 1182.

For communication purposes, the electronic device 1102 also includes a modem 1194, a wireless transceiver 1196, and an antenna (not shown). The wireless transceiver 1196 provides connectivity to respective networks and other electronic devices connected therewith using radio-frequency (RF) wireless signals and may include the transceiver circuitry of FIG. 9. The wireless transceiver 1196 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of aspect, an element, or any portion of an element, or any combination of elements described herein may be implemented as a "processing system" that includes one or more processors. Aspects of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout the disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more aspect embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of aspect, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Illustrative aspects of the disclosure include:

Aspect 1. A stacked acoustic wave (AW) filter circuit, comprising: a first substrate comprising a first surface and a second surface, wherein the second surface is opposite the first surface; a first AW resonator circuit positioned on the first surface of the first substrate; a plurality of elements including a first element, wherein the plurality of elements are positioned on the second surface of the first substrate, and wherein the first element is aligned with the first AW resonator circuit; and a second substrate comprising a first surface and a second surface, wherein the plurality of elements are positioned on the first surface of the second substrate, and wherein the plurality of elements create a cavity between the first substrate and the second substrate.

Aspect 2. The stacked AW filter circuit of Aspect 1, further comprising: a second AW resonator circuit positioned on the first surface of the second substrate in the cavity between the first substrate and the second substrate.

Aspect 3. The stacked AW filter circuit of any of Aspects 1 to 2, wherein the second AW resonator circuit is positioned between the first element and a second element, such that the first element and the second element provide mechanical support for the cavity to prevent the second AW resonator circuit from contacting the first substrate.

Aspect 4. The stacked AW filter circuit of any of Aspects 1 to 3, further comprising: a first plurality of AW resonator circuits disposed on the first surface of the first substrate, the first plurality of AW resonator circuits including the first AW resonator circuit; and a second plurality of AW resonator circuits disposed on the first surface of the second substrate, the second plurality of AW resonator circuits including the second AW resonator circuit; wherein the first plurality of AW resonator circuits and the second plurality of AW resonator circuits are each electrically coupled to a corresponding signal path as portions of a radio frequency (RF) filter.

Aspect 5. The stacked AW filter circuit of any of Aspects 1 to 4, further comprising: a mold material covering at least a portion of the second surface of the second substrate, wherein the mold material is aligned with a position of the second AW resonator circuit to dampen reflections of bulk waves entering the second substrate from the second AW resonator circuit.

Aspect 6. The stacked AW filter circuit of any of Aspects 1 to 5, further comprising: a cap substrate having a first surface and a second surface; and a second plurality of elements positioned on the first surface of the first substrate and the second surface of the cap substrate to create a second cavity, wherein the second cavity is positioned between the first substrate and the cap substrate.

Aspect 7. The stacked AW filter circuit of any of Aspects 1 to 6, further comprising: at least one conductive interconnect mounted on the first surface of the cap substrate and electrically coupled to the first AW resonator circuit as part of a radio frequency (RF) filter.

Aspect 8. The stacked AW filter circuit of any of Aspects 1 to 7, wherein the plurality of elements comprise polymer elements, and wherein the second plurality of elements comprise polymer elements.

Aspect 9. The stacked AW filter circuit of any of Aspects 1 to 8, wherein the plurality of elements comprise uniform or structured metal elements, and wherein the second plurality of elements comprise uniform or structured metal elements.

Aspect 10. The stacked AW filter circuit of any of Aspects 1 to 9, further comprising: a uniform polymer layer covering at least a portion of the second surface of the first substrate within a range of a reflected bulk wave path from the first AW resonator circuit through the first substrate.

Aspect 11. The stacked AW filter circuit of any of Aspects 1 to 10, wherein the plurality of elements provide structural support to maintain a physical position of the first substrate and the second substrate within the stacked AW filter circuit.

Aspect 12. The stacked AW filter circuit of any of Aspects 1 to 11, further comprising a polymer frame disposed on the second surface of the first substrate and on the first surface of the second substrate, wherein the polymer frame is positioned at edge portions of the first surface of the second substrate and edge portions of the second surface of the first substrate to enclose the cavity.

Aspect 13. The stacked AW filter circuit of any of Aspects 1 to 12, wherein the first element extends from the polymer frame at an edge portion of the first surface of the second substrate into the cavity.

Aspect 14. The stacked AW filter circuit of any of Aspects 1 to 13, wherein the first element is positioned within the cavity without connecting to the polymer frame at the edge portions of the first surface of the second substrate or the edge portions of the second surface of the first substrate.

Aspect 15. The stacked AW filter circuit of any of Aspects 1 to 14, wherein the first AW resonator circuit comprises a plurality of a surface acoustic wave (SAW) resonators.

Aspect 16. The stacked AW filter circuit of any of Aspects 1 to 15, wherein the first element is aligned with the first AW resonator circuit such that one or more bulk waves enter the first substrate from the first AW resonator circuit at positions between the first AW resonator circuit and the first element.

Aspect 17. The stacked AW filter circuit of any of Aspects 1 to 16, wherein the first element is a polymer structural support wall for the first substrate, and wherein the first element is positioned such that one or more bulk waves enter the first substrate from the first AW resonator and are reflected where the second surface of the first substrate is in contact with the first element.

Aspect 18. The stacked AW filter circuit of any of Aspects 1 to 17, wherein the first AW resonator comprises an interdigital transducer (IDT) electrode structure positioned on a piezoelectric surface in a first plane parallel to the first surface of the first substrate; wherein the first element contacts the second surface of the first substrate in an acoustic reflection dampening area of a second plane parallel to the first plane.

Aspect 19. The stacked AW filter circuit of any of Aspects 1 to 18, wherein the first element is positioned such that a projection of an area of the IDT electrode structure onto the second plane in a direction perpendicular to the first plane results in the projection at the second plane overlapping with the acoustic reflection dampening area in the second plane.

Aspect 20. The stacked AW filter circuit of any of Aspects 1 to 19 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

Aspect 21. The stacked AW filter circuit of any of Aspects 1 to 20 integrated into a radio frequency (RF) front-end circuit of a transceiver.

Aspect 22. The stacked AW filter circuit of any of Aspects 1 to 21, wherein the front-end circuit of the transceiver comprises a multiplexer coupled to an antenna, wherein the multiplexer comprises the stacked AW filter circuit.

Aspect 23. A method for filtering a radio frequency (RF) signal, the method comprising: providing a signal at an interconnect of a stacked acoustic wave (AW) filter package, wherein the interconnect is positioned on a cap substrate; exciting an acoustic wave at a first AW resonator circuit positioned on a first substrate at a separate stack layer from the cap substrate, wherein the first AW resonator circuit is electrically coupled to the interconnect, and wherein the first AW resonator circuit is positioned within a first cavity supported by elements between the cap substrate and the first substrate; and dampening bulk waves in the first substrate from the first AW resonator circuit using a reflection suppression element positioned at an opposite side of the first substrate from the first AW resonator circuit, wherein the reflection suppression element further is positioned to support a second cavity between the first substrate and a second substrate, and wherein the second substrate is at an additional separate stack layer from both the cap substrate and the first substrate.

Aspect 24. The method of Aspect 23, wherein the reflection suppression element comprises a metal element in a uniform metal layer.

Aspect 25. A wireless communication apparatus comprising: a stacked acoustic wave (AW) filter package comprising: a first substrate having a first plurality of AW resonator circuits positioned on a top side; a second substrate having a second plurality of AW resonator circuits positioned on a top side; a frame positioned between the first substrate and the second substrate to create a cavity between a bottom side of the first substrate and the top side of the second substrate; and one or more acoustic reflection suppressing structural walls supporting the cavity between the bottom side of the first substrate and the top side of the second substrate, the one or more acoustic reflection suppressing structural walls being positioned at selected positions on a back side of the first substrate to dampen selected acoustic bulk wave paths from the first plurality of AW resonator circuits that generate interference in signal paths of the stacked AW filter package.

Aspect 26. The wireless communication apparatus of Aspect 25 further comprising: one or more non-structural elements positioned at a portion of the back side of the first substrate to dampen second selected acoustic bulk wave paths from the first plurality of AW resonator circuits that generate interference in the signal paths of the stacked AW filter package.

Aspect 27. The wireless communication apparatus of any of Aspects 25 to 26, wherein the one or more acoustic reflection suppressing structural walls and the one or more non-structural elements comprise a polymer material in a shared fabrication layer.

Aspect 28. The wireless communication apparatus of any of Aspects 25 to 27, further comprising: one or more antennas; and processing circuitry, wherein the one or more antennas and the processing circuitry are communicatively coupled via the signal paths of the stacked AW filter package, and wherein the first plurality of AW resonator circuits and the second plurality of AW resonator circuits are electrically coupled to form one or more radio frequency (RF) filters for signals traveling between the one or more antennas and the processing circuitry.

Aspect 29. A wireless communication apparatus, comprising: a first substrate comprising a first surface and a second surface, wherein the second surface is opposite the first surface; first electroacoustic means for filtering a radio frequency signal, wherein the first electroacoustic means is positioned on the first surface of the first substrate; and means for suppressing acoustic bulk waves at the second surface of the first substrate.

Aspect 30. The wireless communication apparatus of Aspect 29, wherein the means for suppressing acoustic bulk waves further comprises means for providing structural support for the first substrate.

Aspect 31. A storage medium comprising instructions that, when executed by processing circuitry of a device, cause the device to perform operations in accordance with any aspect above.

Aspect 32. A method for filtering a signal in accordance with any aspect above.

Aspect 33. A device comprising means for filtering a signal in accordance with any aspect above.

The phrase "coupled to" and the term "coupled" refers to any component that is physically connected to another component either directly or indirectly, and/or any component that is in communication with another component (e.g., connected to the other component over a wired or wireless connection, and/or other suitable communication interface) either directly or indirectly. Generally, where there are operations illustrated in figures, those operations may have corresponding counterpart means-plus-function components with similar numbering.

As used herein, the term "determining" encompasses a wide variety of actions. For aspect, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A stacked acoustic wave (AW) filter circuit, comprising:
   a first substrate comprising a first surface and a second surface, wherein the second surface is opposite the first surface;
   a first AW resonator circuit positioned on the first surface of the first substrate;
   a plurality of elements including a first element, wherein the plurality of elements are positioned on the second surface of the first substrate, and wherein the first element is aligned with the first AW resonator circuit; and
   a second substrate disposed below the first substrate, the second substrate comprising a first surface and a second surface, wherein the plurality of elements are positioned on the first surface of the second substrate, and wherein the plurality of elements create a cavity between the first substrate and the second substrate;
   a second AW resonator circuit positioned on the first surface of the second substrate in the cavity between the first substrate and the second substrate, wherein the second AW resonator circuit is positioned between the first element and a second element, such that the first element and the second element provide mechanical support for the cavity to prevent the second AW resonator circuit from contacting the first substrate.

2. The stacked AW filter circuit of claim 1 integrated into a radio frequency (RF) front-end circuit of a transceiver.

3. The stacked AW filter circuit of claim 2, wherein the front-end circuit of the transceiver comprises a multiplexer coupled to an antenna, wherein the multiplexer comprises the stacked AW filter circuit.

4. The stacked AW filter circuit of claim 1, further comprising:
a first plurality of AW resonator circuits disposed on the first surface of the first substrate, the first plurality of AW resonator circuits including the first AW resonator circuit; and
a second plurality of AW resonator circuits disposed on the first surface of the second substrate, the second plurality of AW resonator circuits including the second AW resonator circuit;
wherein the first plurality of AW resonator circuits and the second plurality of AW resonator circuits are each electrically coupled to a corresponding signal path as portions of a radio frequency (RF) filter.

5. The stacked AW filter circuit of claim 1, further comprising:
a dampening material covering at least a portion of the second surface of the second substrate, wherein the dampening material is aligned with a position of the second AW resonator circuit to dampen reflections of bulk waves entering the second substrate from the second AW resonator circuit.

6. The stacked AW filter circuit of claim 1, further comprising:
a cap substrate having a first surface and a second surface; and
a second plurality of elements positioned on the first surface of the first substrate and the second surface of the cap substrate to create a second cavity, wherein the second cavity is positioned between the first substrate and the cap substrate.

7. The stacked AW filter circuit of claim 6, further comprising:
at least one conductive interconnect mounted on the first surface of the cap substrate and electrically coupled to the first AW resonator circuit as part of a radio frequency (RF) filter.

8. The stacked AW filter circuit of claim 6, wherein the plurality of elements comprise polymer elements, and wherein the second plurality of elements comprise polymer elements.

9. The stacked AW filter circuit of claim 6, wherein the plurality of elements comprise uniform or structured metal elements, and wherein the second plurality of elements comprise uniform or structured metal elements.

10. The stacked AW filter circuit of claim 1, further comprising:
a uniform or structured polymer layer covering at least a portion of the second surface of the first substrate within a range of a reflected bulk wave path from the first AW resonator circuit through the first substrate.

11. The stacked AW filter circuit of claim 1, wherein the plurality of elements provide structural support to maintain a physical position of the first substrate and the second substrate within the stacked AW filter circuit.

12. The stacked AW filter circuit of claim 1, further comprising a polymer frame disposed on the second surface of the first substrate and on the first surface of the second substrate, wherein the polymer frame is positioned at edge portions of the first surface of the second substrate and edge portions of the second surface of the first substrate to enclose the cavity.

13. The stacked AW filter circuit of claim 12, wherein the first element extends from the polymer frame at an edge portion of the first surface of the second substrate into the cavity.

14. The stacked AW filter circuit of claim 12, wherein the first element is positioned within the cavity without connecting to the polymer frame at the edge portions of the first surface of the second substrate or the edge portions of the second surface of the first substrate.

15. The stacked AW filter circuit of claim 1, wherein the first AW resonator circuit comprises a plurality of a surface acoustic wave (SAW) resonators.

16. The stacked AW filter circuit of claim 1, wherein the first element is aligned with the first AW resonator circuit such that one or more bulk waves enter the first substrate from the first AW resonator circuit at positions between the first AW resonator circuit and the first element.

17. The stacked AW filter circuit of claim 1, wherein the first element is a polymer structural support wall for the first substrate, and wherein the first element is positioned such that one or more bulk waves enter the first substrate from the first AW resonator circuit and are reflected where the second surface of the first substrate is in contact with the first element.

18. The stacked AW filter circuit of claim 1, wherein the first AW resonator circuit comprises an interdigital transducer (IDT) electrode structure positioned on a piezoelectric surface in a first plane parallel to the first surface of the first substrate;
wherein the first element contacts the second surface of the first substrate in an acoustic reflection dampening area of a second plane parallel to the first plane.

19. The stacked AW filter circuit of claim 18, wherein the first element is positioned such that a projection of an area of the IDT electrode structure onto the second plane in a direction perpendicular to the first plane results in the projection at the second plane overlapping with the acoustic reflection dampening area in the second plane.

20. The stacked AW filter circuit of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

21. A method for filtering a radio frequency (RF) signal, the method comprising:
providing a signal at an interconnect of a stacked acoustic wave (AW) filter package, wherein the interconnect is positioned on a cap substrate;
exciting an acoustic wave at a first AW resonator circuit positioned on a first substrate at a separate stack layer from the cap substrate, wherein the first AW resonator circuit is electrically coupled to the interconnect, and wherein the first AW resonator circuit is positioned within a first cavity supported by elements between the cap substrate and the first substrate; and
dampening bulk waves in the first substrate from the first AW resonator circuit using a reflection suppression element positioned at an opposite side of the first substrate from the first AW resonator circuit, wherein the reflection suppression element further is positioned to support a second cavity between the first substrate and a second substrate, and wherein the second substrate is at an additional separate stack layer from both the cap substrate and the first substrate.

22. The method of claim 21, wherein the reflection suppression element comprises a metal element in a uniform or structured metal layer.

23. A wireless communication apparatus comprising:
a stacked acoustic wave (AW) filter package comprising:
a first substrate having a first plurality of AW resonator circuits positioned on a top side;
a second substrate having a second plurality of AW resonator circuits positioned on a top side;
a frame positioned between the first substrate and the second substrate to create a cavity between a bottom side of the first substrate and the top side of the second substrate; and
one or more acoustic reflection suppressing structural walls supporting the cavity between the bottom side of the first substrate and the top side of the second substrate, the one or more acoustic reflection suppressing structural walls being positioned at selected positions on a back side of the first substrate to dampen selected acoustic bulk wave paths from the first plurality of AW resonator circuits that generate interference in signal paths of the stacked AW filter package.

24. The wireless communication apparatus of claim 23 further comprising:
one or more non-structural elements positioned at a portion of the back side of the first substrate to dampen second selected acoustic bulk wave paths from the first plurality of AW resonator circuits that generate interference in the signal paths of the stacked AW filter package.

25. The wireless communication apparatus of claim 24, wherein the one or more acoustic reflection suppressing structural walls and the one or more non-structural elements comprise a polymer material in a shared fabrication layer.

26. The wireless communication apparatus of claim 25, further comprising:
one or more antennas; and
processing circuitry, wherein the one or more antennas and the processing circuitry are communicatively coupled via the signal paths of the stacked AW filter package, and wherein the first plurality of AW resonator circuits and the second plurality of AW resonator circuits are electrically coupled to form one or more radio frequency (RF) filters for signals traveling between the one or more antennas and the processing circuitry.

27. A stacked acoustic wave (AW) filter circuit, comprising:
a first substrate comprising a first surface and a second surface, wherein the second surface is opposite the first surface;
a first AW resonator circuit positioned on the first surface of the first substrate and comprising an interdigital transducer (IDT) electrode structure positioned on a piezoelectric surface in a first plane parallel to the first surface of the first substrate;
a plurality of elements including a first element, wherein the plurality of elements are positioned on the second surface of the first substrate, and wherein the first element is aligned with the first AW resonator circuit; and
a second substrate disposed below the first substrate, the second substrate comprising a first surface and a second surface, wherein the plurality of elements are positioned on the first surface of the second substrate, and wherein the plurality of elements create a cavity between the first substrate and the second substrate, wherein the first element contacts the second surface of the first substrate in an acoustic reflection dampening area of a second plane parallel to the first plane.

28. The stacked AW filter circuit of claim 27, wherein the first element is positioned such that a projection of an area of the IDT electrode structure onto the second plane in a direction perpendicular to the first plane results in the projection at the second plane overlapping with the acoustic reflection dampening area in the second plane.

29. The stacked AW filter circuit of claim 27 further comprising a second AW resonator circuit positioned on the first surface of the second substrate in the cavity between the first substrate and the second substrate.

* * * * *